US012682964B2

(12) United States Patent
Cao et al.

(10) Patent No.: US 12,682,964 B2
(45) Date of Patent: Jul. 14, 2026

(54) APPARATUS AND METHODS FOR HOLE CURRENT PROGRAM VERIFY OPERATIONS

(71) Applicant: Sandisk Technologies Inc., Milpitas, CA (US)

(72) Inventors: Wei Cao, Fremont, CA (US); Jiahui Yuan, Fremont, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 72 days.

(21) Appl. No.: 18/675,685

(22) Filed: May 28, 2024

(65) Prior Publication Data

US 2025/0372183 A1 Dec. 4, 2025

(51) Int. Cl.
*G11C 16/34* (2006.01)
*G11C 16/04* (2006.01)
*G11C 16/10* (2006.01)

(52) U.S. Cl.
CPC ...... *G11C 16/3427* (2013.01); *G11C 16/0483* (2013.01); *G11C 16/10* (2013.01); *G11C 16/3459* (2013.01)

(58) Field of Classification Search
CPC . G11C 16/3427; G11C 16/0483; G11C 16/10; G11C 16/3459
See application file for complete search history.

(56) References Cited

U.S. PATENT DOCUMENTS

| | | | |
|---|---|---|---|
| 8,514,621 B2 * | 8/2013 | Choi | G11C 11/5628 |
| | | | 365/185.12 |
| 8,593,877 B2 * | 11/2013 | Joo | G11C 16/30 |
| | | | 365/185.24 |
| 9,607,707 B1 | 3/2017 | Pang et al. | |
| 9,620,233 B1 | 4/2017 | Dong et al. | |
| 11,081,162 B1 | 8/2021 | Puthenthermadam et al. | |
| 11,615,855 B2 * | 3/2023 | Choi | G11C 16/24 |
| | | | 365/185.02 |
| 11,972,820 B2 | 4/2024 | Guo et al. | |
| 2008/0019164 A1 | 1/2008 | Hemink et al. | |
| 2020/0234778 A1 | 7/2020 | Zhao et al. | |
| 2021/0319833 A1 | 10/2021 | Yabe | |
| 2023/0069260 A1 | 3/2023 | Lien et al. | |
| 2024/0079062 A1 | 3/2024 | Guo et al. | |
| 2024/0112743 A1 | 4/2024 | Zhang et al. | |

OTHER PUBLICATIONS

International Search Report and Written Opinion for PCT Application No. PCT/US2025/011302 dated Jul. 8, 2025.

* cited by examiner

*Primary Examiner* — Vanthu T Nguyen
(74) *Attorney, Agent, or Firm* — PEARL COHEN ZEDEK LATZER BARATZ LLP

(57) ABSTRACT

An apparatus is provided that includes a NAND string including a first memory cell coupled to a first word line, and a control circuit coupled to the NAND string. The control circuit is configured to apply a verify voltage to the first word line, perform a verify test on the first memory cell to sense a hole conduction current, and perform a program operation on the first memory cell without performing a pre-charge operation.

9 Claims, 20 Drawing Sheets

600

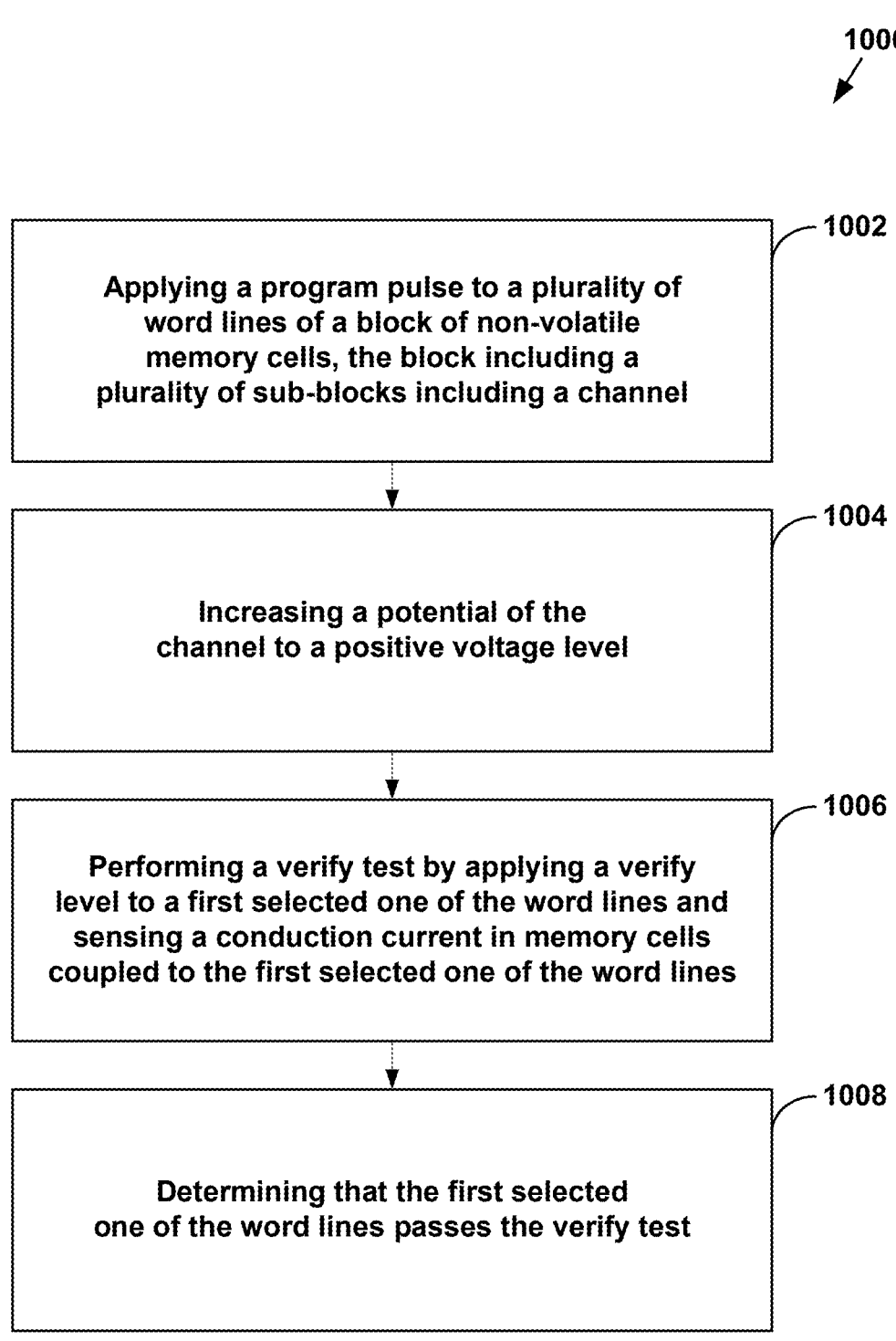

1000

1002

Applying a program pulse to a plurality of word lines of a block of non-volatile memory cells, the block including a plurality of sub-blocks including a channel

1004

Increasing a potential of the channel to a positive voltage level

1006

Performing a verify test by applying a verify level to a first selected one of the word lines and sensing a conduction current in memory cells coupled to the first selected one of the word lines

1008

Determining that the first selected one of the word lines passes the verify test

FIG. 10

APPARATUS AND METHODS FOR HOLE CURRENT PROGRAM VERIFY OPERATIONS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

However, various challenges exist in fabricating such non-volatile memory devices.

BRIEF DESCRIPTION OF THE DRAWINGS

Like-numbered elements refer to common components in the different figures.

FIG. 10 is a flow diagram of a process for programming and verifying a threshold voltage of memory cell.

DETAILED DESCRIPTION

Technology is described that uses a hole-current verify operation prior to a program operation of a non-volatile memory cell in a NAND string, with no pre-charge step between the verify operation and the program operation. As described in more detail below, the hole-current verify operation is used to determine if a threshold voltage of a memory cell is above or below a verify voltage. In addition, the hole-current verify operation introduces mobile holes into a channel of the NAND string and increases the channel potential to a positive value. As a result, no separate pre-charge step is needed to eliminate any remaining electrons in the channel prior to programming the memory cell.

The described technology may be used with a block of memory cells that includes multiple sub-blocks, such as string sub-blocks and tiered sub-blocks. Without wanting to be bound by any particular theory, it is believed that the described technology may reduce or eliminate sub-block program disturb caused by residual electrons remaining in a channel after a verify operation. Without wanting to be bound by any particular theory, it is believed that the described technology may reduce a program time by eliminating a pre-charge step between the verify operation and the program operation.

Figure 1:
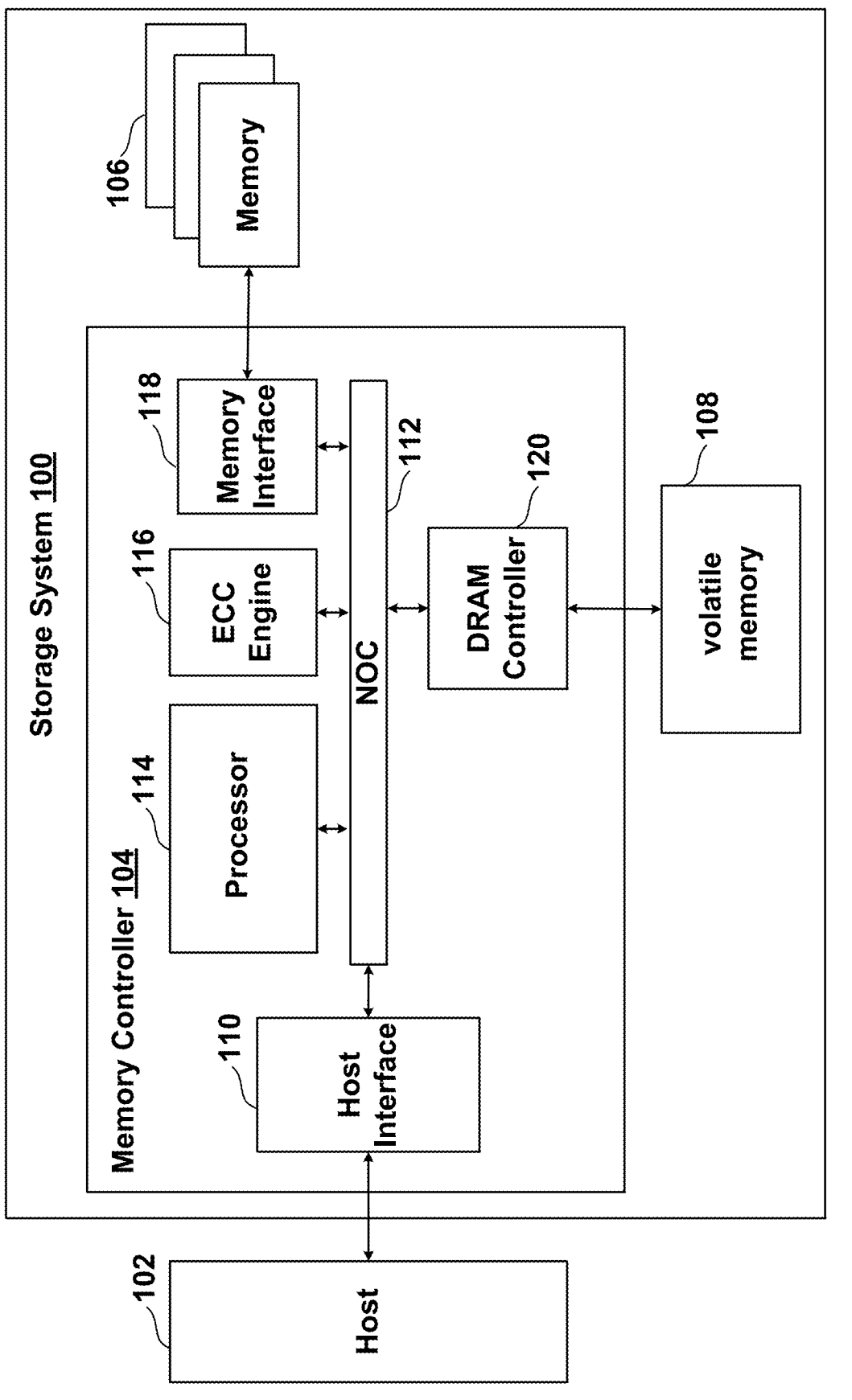
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 also can be a memory card, USB drive or other type of storage system. The proposed technology is not limited to any one type of memory system.

Storage system 100 is connected to a host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 104 connected to non-volatile memory 106 and local high speed volatile memory 108 (e.g., DRAM). Local high speed volatile memory 108 is used by memory controller 104 to perform certain functions. For example, local high speed volatile memory 108 stores logical to physical address translation tables ("L2P tables").

Memory controller 104 includes a host interface 110 that is connected to and in communication with host 102. In one embodiment, host interface 110 implements a NVM Express (NVMe) over PCI Express (PCIe). Other interfaces can also be used, such as SCSI, SATA, etc. Host interface 110 also is connected to a network-on-chip (NOC) 112.

A NOC is a communication subsystem on an integrated circuit. NOCs can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 112 can be replaced by a bus.

Connected to and in communication with NOC 112 is a processor 114, an ECC engine 116, a memory interface 118, and a DRAM controller 120. DRAM controller 120 is used to operate and communicate with local high speed volatile memory 108 (e.g., DRAM). In other embodiments, local high speed volatile memory 108 can be SRAM or another type of volatile memory.

Processor 114 performs the various controller memory operations, such as programming, erasing, reading, and memory management processes. In one embodiment, processor 114 is programmed by firmware. In other embodiments, processor 114 is a custom and dedicated hardware circuit without any software. Processor 114 also implements a translation module, as a software/firmware process or as a dedicated hardware circuit.

In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 104 (e.g., the translation module) performs address translation between the logical addresses used by the host and the physical addresses used by the memory die.

One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables.

Instead, the logical address to physical address tables (or L2P tables) can be any type of data structure. In some examples, the memory space of a storage system is so large that the local memory 108 cannot hold all of the L2P tables. In such a case, the entire set of L2P tables are stored in non-volatile memory 106 and a subset of the L2P tables are cached (L2-P cache) in the local high speed volatile memory 108.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Memory interface 118 communicates with non-volatile memory 106. In one embodiment, memory interface 118 provides a Toggle Mode interface. In another embodiment, memory interface 118 provides a double data rate (DDR) interface. Other interfaces also can be used. In some example implementations, memory interface 118 (or another portion of controller 104) implements a scheduler and buffer for transmitting data to and receiving data from one or more memory die.

Figure 2A:
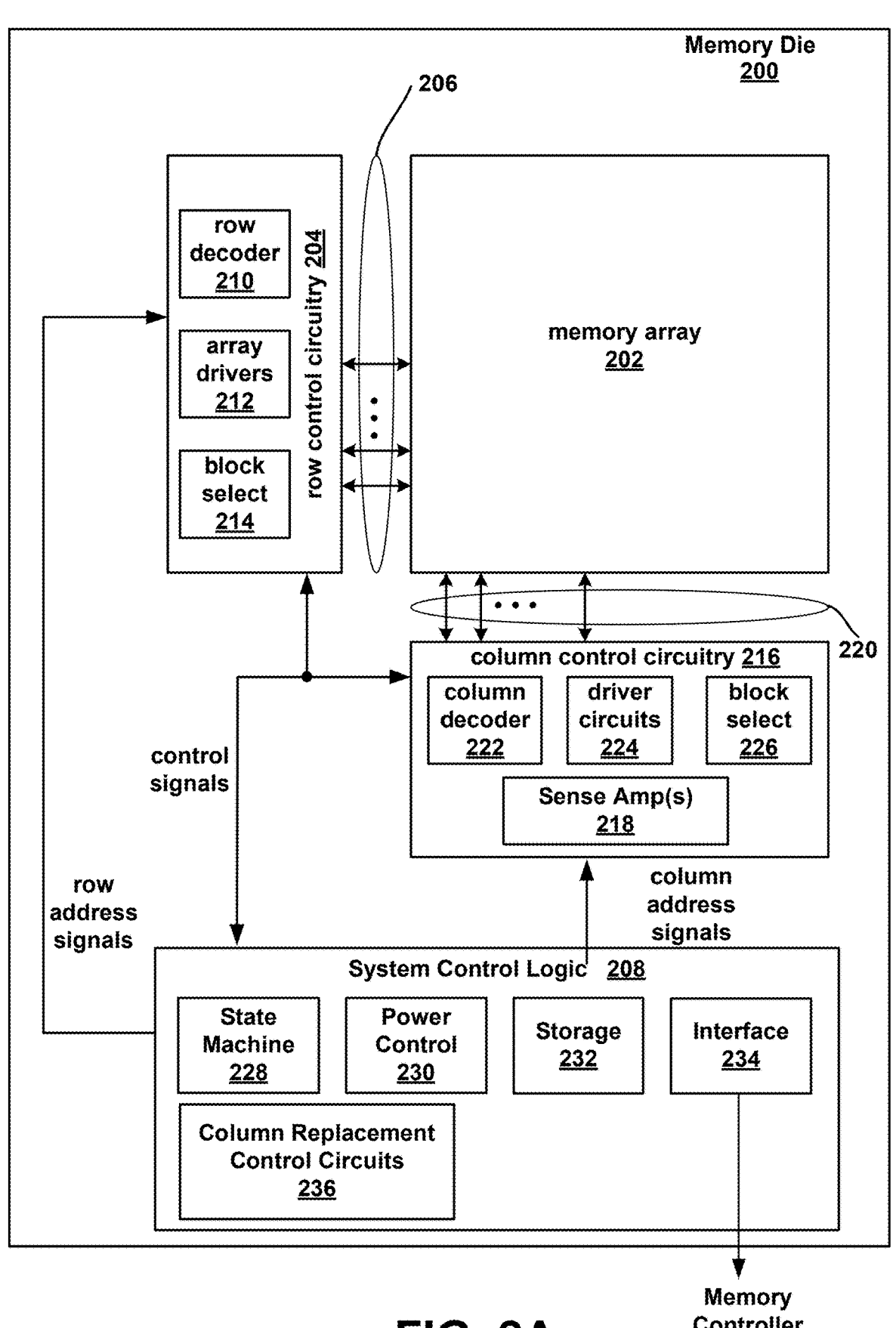
FIG. 2A is a block diagram of one embodiment of a memory die.

In one embodiment, non-volatile memory 106 includes one or more memory die. FIG. 2A is a functional block diagrams of one embodiment of a memory die 200 that includes non-volatile memory 106. Each of the one or more memory die of non-volatile memory 106 can be implemented as memory die 200 of FIG. 2A. The components depicted in FIG. 2A are electrical circuits.

Memory die 200 includes a memory array 202 that can include non-volatile memory cells, as described in more detail below. The array terminal lines of memory array 202 include the various layer(s) of word lines organized as rows, and the various layer(s) of bit lines organized as columns. However, other orientations can also be implemented.

Memory die 200 includes row control circuitry 204, whose outputs 206 are connected to respective word lines of the memory array 202. Row control circuitry 204 receives a group of M row address signals and one or more various control signals from system control logic circuit 208, and typically may include such circuits as row decoders 210, array terminal drivers 212, and block select circuitry 214 for both reading and writing (programming) operations.

Row control circuitry 204 also may include read/write circuitry. Memory die 200 also includes column control circuitry 216 including sense amplifier(s) 218 whose input/outputs 220 are connected to respective bit lines of memory array 202. Although only a single block is shown for memory array 202, a memory die can include multiple arrays that can be individually accessed.

Column control circuitry 216 receives a group of N column address signals and one or more various control signals from system control logic 208, and typically may include such circuits as column decoders 222, array terminal receivers or driver circuits 224, block select circuitry 226, as well as read/write circuitry, and I/O multiplexers.

System control logic 208 receives data and commands from memory controller 104 (FIG. 1) and provides output data and status to host 102. In some embodiments, system control logic 208 (which includes one or more electrical circuits) includes a state machine 228 that provides die-level control of memory operations.

In one embodiment, state machine 228 is programmable by software. In other embodiments, state machine 228 does not use software and is completely implemented in hardware (e.g., electrical circuits). In another embodiment, state machine 228 is replaced by a micro-controller or microprocessor, either on or off the memory chip.

System control logic 208 also can include a power control module 230 that controls the power and voltages supplied to the rows and columns of memory structure 202 during memory operations and may include charge pumps and regulator circuit for creating regulating voltages. System control logic 208 includes storage 232 (e.g., RAM, registers, latches, etc.), which may be used to store parameters for operating memory array 202.

Commands and data are transferred between memory controller 104 and memory die 200 via memory controller interface 234 (also referred to as a "communication interface"). Memory controller interface 234 is an electrical interface for communicating with memory controller 104. Examples of memory controller interface 234 include a Toggle Mode Interface, a DDR interface and an Open NAND Flash Interface (ONFI). Other I/O interfaces can also be used. In a DDR clock scheme, rising edges and falling edges of a clock signal are sampling transitions.

In an embodiment, system control logic 208 also includes column replacement control circuits 236, described in more detail below.

In some embodiments, all elements of memory die 200, including the system control logic 208, can be formed as part of a single die. In other embodiments, some or all of the system control logic 208 can be formed on a different die.

In one embodiment, memory structure 202 comprises a three-dimensional memory array of non-volatile memory cells in which multiple memory levels are formed above a single substrate, such as a wafer. Memory structure 202 may include any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein.

Other examples of suitable technologies for memory cells of memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells.

In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light.

In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to memory structure 202. However, this reduces the area of the memory die available for the peripheral circuitry. This can place quite severe restrictions on these elements of the peripheral circuitry.

For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 is the amount of area to devote to memory structure 202 and the amount of area to devote to the peripheral circuitry.

Another area in which memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based.

For example, elements such sense amplifier circuits, charge pumps, logic elements in a state machine, and other peripheral circuitry in system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, memory structure 202 can be formed on one die (referred to as the memory die) and some or all of the peripheral circuitry elements, including one or more control circuits, can be formed on a separate die (referred to as the control die).

For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
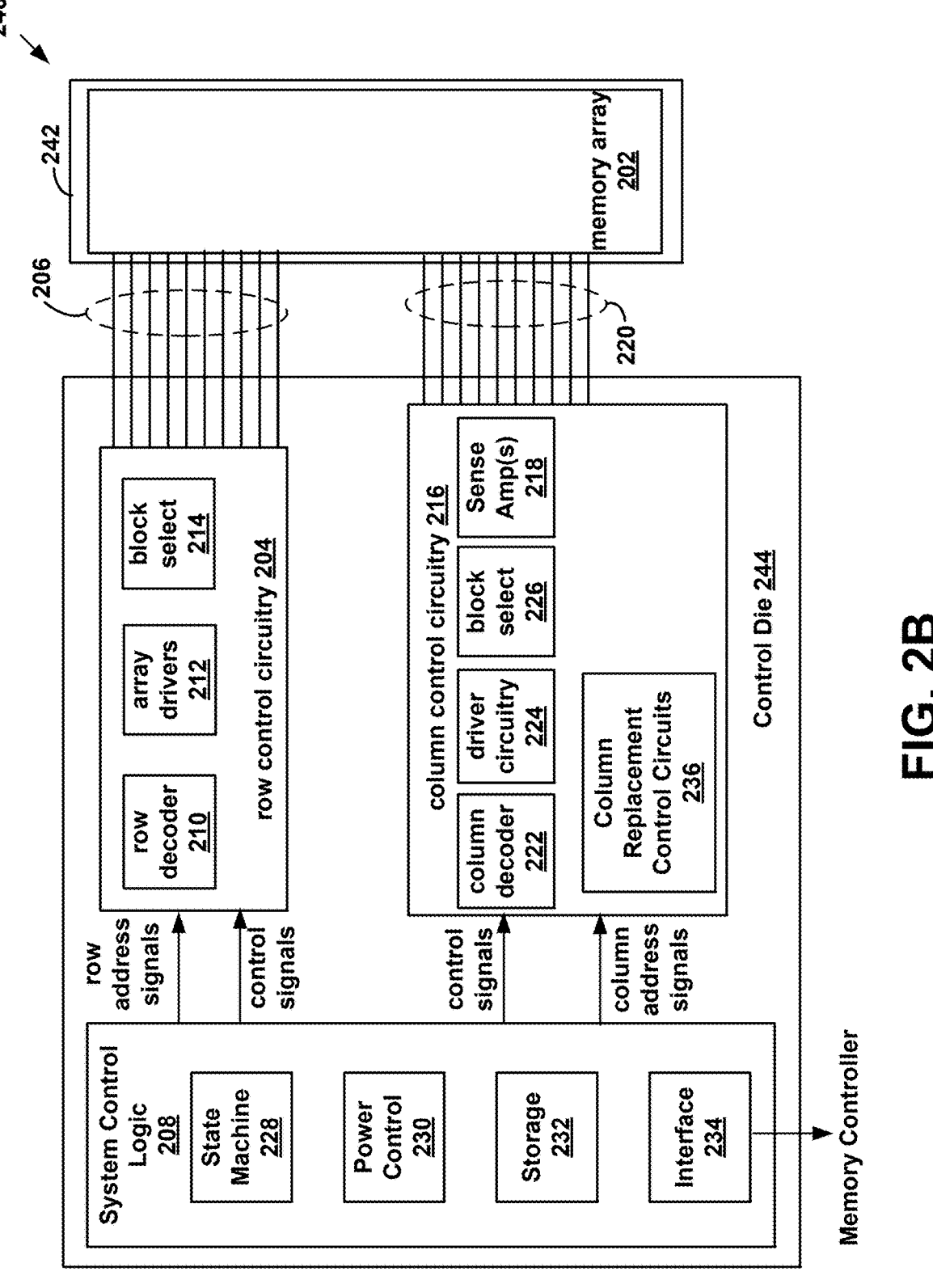
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 240. One or more integrated memory assemblies 240 may be used to implement the non-volatile memory 106 of storage system 100.

Integrated memory assembly 240 includes two types of semiconductor die (or more succinctly, "die"). Memory die 242 includes memory structure 202. Memory structure 202 includes non-volatile memory cells. Control die 244 includes control circuitry 208, 216, and 204 (as described above). In some embodiments, control die 244 is configured to connect to memory structure 202 in memory die 242. In some embodiments, memory die 242 and control die 244 are bonded together.

FIG. 2B shows an example of the peripheral circuitry, including control circuits, formed in a peripheral circuit or control die 244 coupled to memory structure 202 formed in memory die 242. Common components are labelled similarly to FIG. 2A. System control logic 208, row control circuitry 204, and column control circuitry 216 are located in control die 244. In some embodiments, all or a portion of column control circuitry 216 and all or a portion of row control circuitry 204 are located on memory die 242. In some embodiments, some of the circuitry in system control logic 208 is located on memory die 242.

System control logic 208, row control circuitry 204, and column control circuitry 216 may be formed by a common process (e.g., CMOS process), so that adding elements and functions, such as ECC, more typically found on a memory controller 104 may require few or no additional process steps (i.e., the same process steps used to fabricate controller 104 may also be used to fabricate system control logic 208, row control circuitry 204, and column control circuitry 216).

Thus, while moving such circuits from a die such as memory 242 may reduce the number of steps needed to fabricate such a die, adding such circuits to a die such as control die 244 may not require many additional process steps. Control die 244 also could be referred to as a CMOS die, due to the use of CMOS technology to implement some or all of control circuitry 204, 208, 216.

FIG. 2B shows column control circuitry 216 including sense amplifier(s) 218 on control die 244 coupled to memory structure 202 on memory die 242 through electrical paths 220. For example, electrical paths 220 may provide electrical connection between column decoder 222, driver circuitry 224, and block select 226 and bit lines of memory structure 202. In an embodiment, column control circuitry 216 also includes column replacement control circuits 236, described in more detail below.

Electrical paths may extend from column control circuitry 216 in control die 244 through pads on control die 244 that are bonded to corresponding pads of the memory die 242, which are connected to bit lines of memory structure 202. Each bit line of memory structure 202 may have a corresponding electrical path in electrical paths 220, including a pair of bond pads, which connects to column control circuitry 216.

Similarly, row control circuitry 204, including row decoder 210, array drivers 212, and block select 214 are coupled to memory structure 202 through electrical paths 206. Each of electrical path 206 may correspond to a word line, dummy word line, or select gate line. Additional electrical paths may also be provided between control die 244 and memory die 242.

For purposes of this document, the phrases "a control circuit" or "one or more control circuits" can include any one of or any combination of memory controller 104, state machine 228, all or a portion of system control logic 208, all or a portion of row control circuitry 204, all or a portion of column control circuitry 216, a microcontroller, a microprocessor, and/or other similar functioned circuits.

The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In some embodiments, there is more than one control die 244 and more than one memory die 242 in an integrated memory assembly 240. In some embodiments, the integrated memory assembly 240 includes a stack of multiple control dies 244 and multiple memory die 242.

Figure 3A:
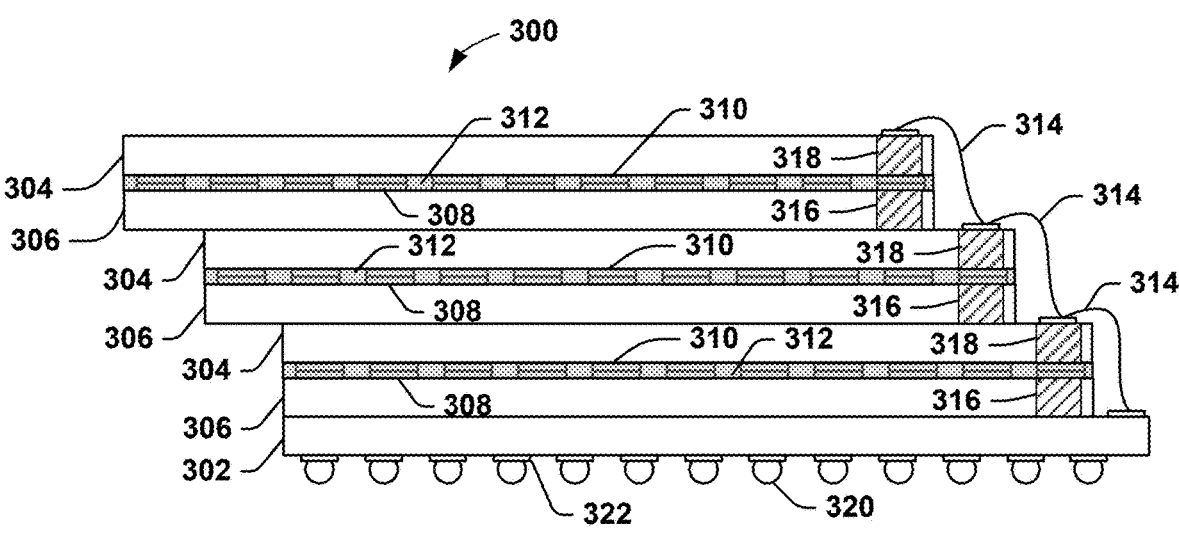
FIGS. 3A and 3B depict different embodiments of integrated memory assemblies.

FIG. 3A depicts a side view of an embodiment of an integrated memory assembly 300 stacked on a substrate 302 (e.g., a stack including control die 304 and memory die 306). The integrated memory assembly 300 has three control die 304 and three memory die 306. In some embodiments, there are more than three memory dies 306 and more than three control dies 304.

Each control die 304 is affixed (e.g., bonded) to at least one memory die 306. Some of the bond pads 308/310 are depicted, although there may be many more bond pads. A space between two die 306, 304 that are bonded together is filled with a solid layer 312, which may be formed from epoxy or other resin or polymer. This solid layer 312 protects the electrical connections between the die 306, 304, and further secures the die together. Various materials may be used as solid layer 312, but in embodiments, it may be Hysol epoxy resin from Henkel Corp., having offices in California, USA.

Integrated memory assembly 300 may for example be stacked with a stepped offset, leaving the bond pads at each level uncovered and accessible from above. Wire bonds 314 connected to the bond pads connect control die 304 to substrate 302. A number of such wire bonds may be formed across the width of each control die 304 (i.e., into the page of FIG. 3A).

A memory die through silicon via (TSV) 316 may be used to route signals through each memory die 306. A control die TSV 318 may be used to route signals through each control die 304. The TSVs 316, 318 may be formed before, during or after formation of the integrated circuits in semiconductor die 306, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 320 optionally may be affixed to contact pads 322 on a lower surface of substrate 302. Solder balls 320 may be used to couple integrated memory assembly 300 electrically and mechanically to a host device such as a printed circuit board. Solder balls 320 may be omitted where the integrated memory assembly 300 is to be used as an LGA package. Solder balls 320 may form a part of an interface between integrated memory assembly 300 and memory controller 104 (FIG. 1).

Figure 3B:
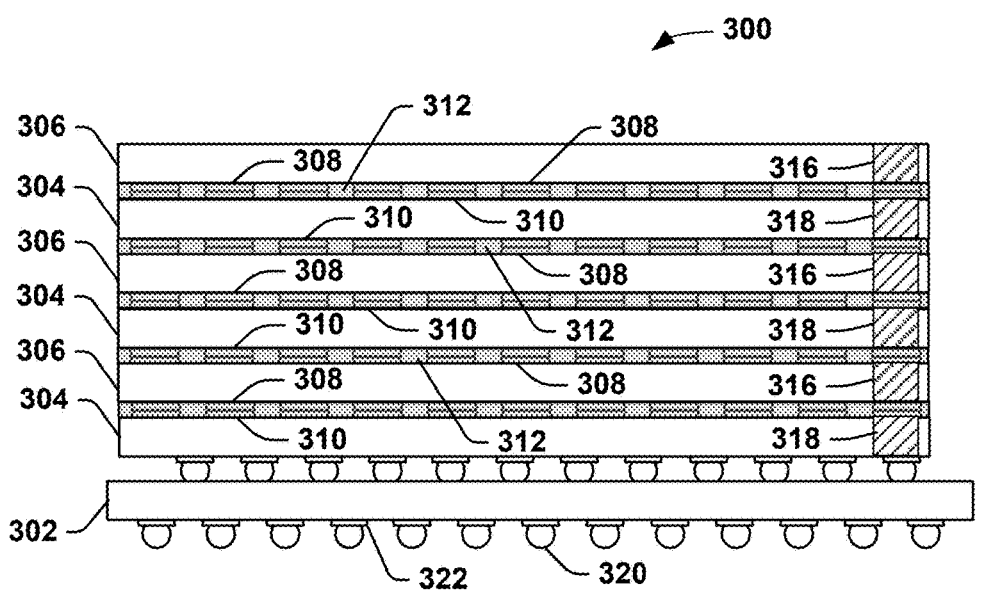

FIG. 3B depicts a side view of another embodiment of an integrated memory assembly 300 stacked on a substrate 302. The integrated memory assembly 300 of FIG. 3B has three control dies 304 and three memory dies 306. In some embodiments, there are many more than three memory dies 306 and many more than three control dies 304. In this example, each control die 304 is bonded to at least one memory die 306. Optionally, a control die 304 may be bonded to two or more memory dies 306.

Some of the bond pads 308, 310 are depicted. There may be many more bond pads. A space between two die 306, 304 that are bonded together is filled with a solid layer 312, which may be formed from epoxy or other resin or polymer. In contrast to the example in FIG. 3A, integrated memory assembly 300 of FIG. 3B does not have a stepped offset. A memory die TSV 316 may be used to route signals through each memory die 306. A control die TSV 318 may be used to route signals through each control die 304.

As has been briefly discussed above, control die 304 and memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process.

In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension.

Such bonds may be formed at room temperature, though heat also may be applied. In embodiments using cu-to-cu bonding, the bond pads may be about 5 µm square and spaced from each other with a pitch of 5 µm to 5 µm.

Although this process is referred to herein as cu-to-cu bonding, this term also may apply even where the bond pads are formed of materials other than copper.

When the area of bond pads is small, it may be difficult to bond the semiconductor die together. The size of and pitch between bond pads may be further reduced by providing a film layer on the surfaces of the semiconductor die including the bond pads. The film layer is provided around the bond pads. When the die are brought together, the bond pads may bond to each other, and the film layers on the respective die may bond to each other.

Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller (or greater) sizes and pitches.

Some embodiments may include a film on the surface of control die 304 and memory die 306. Where no such film is initially provided, a space between the die may be under filled with an epoxy or other resin or polymer. The under-fill material may be applied as a liquid which then hardens into a solid layer. This under-fill step protects the electrical connections between control die 304 and memory die 306, and further secures the die together. Various materials may be used as under-fill material, such as Hysol epoxy resin from Henkel Corp., having offices in California, USA.

Figure 4A:
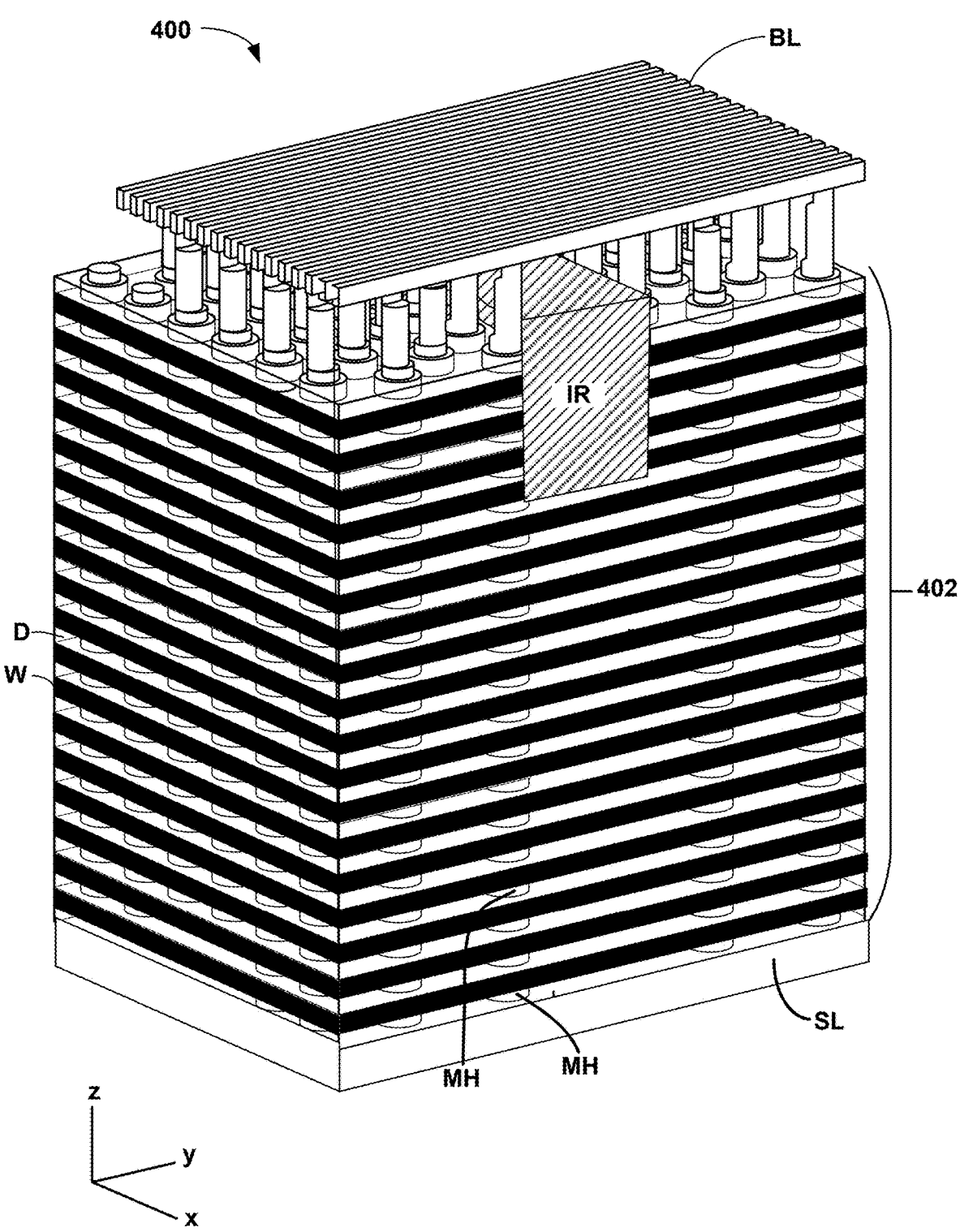
FIG. 4A is a perspective view of a portion of one embodiment of a monolithic three dimensional memory structure.

FIG. 4A is a perspective view of a portion of one example embodiment of a monolithic three dimensional memory array/structure included in memory structure 202, which includes a plurality non-volatile memory cells arranged as vertical NAND strings. For example, FIG. 4A shows a portion 400 of one block of memory.

The structure depicted includes a set of bit lines BL positioned above a stack 402 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into four or five (or a different number of) regions by isolation regions IR. FIG. 4A shows one isolation region IR separating two regions. Below the alternating dielectric layers and word line layers is a source line layer SL. Memory holes are formed in the stack of alternating dielectric layers and conductive layers.

For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

Each memory cell can store one or more bits of data. Thus, the non-volatile memory cells are arranged in memory holes. More details of the three dimensional monolithic memory array that comprises memory structure 202 is provided below.

Figure 4B:
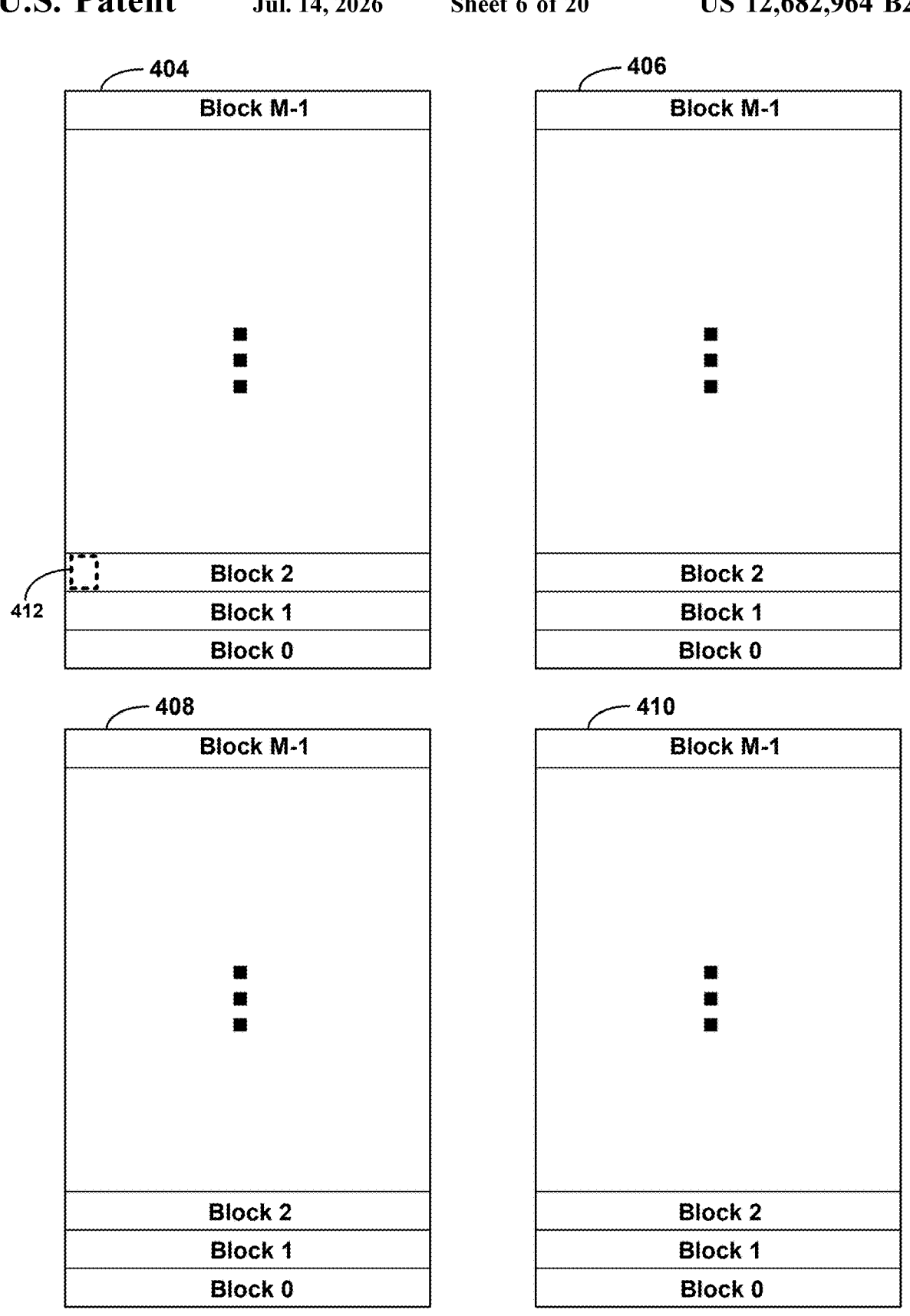
FIG. 4B is a block diagram of one embodiment of a memory structure having four planes.

FIG. 4B is a block diagram explaining one example organization of memory structure 202, which is divided into four planes 404, 406, 408 and 410. Each plane is then divided into M blocks. In one example, each plane has about 2000 blocks. However, different numbers of blocks and planes can also be used.

In one embodiment, a block of memory cells is a unit of erase. That is, all memory cells of a block are erased together. In other embodiments, blocks can be divided into sub-blocks and the sub-blocks can be the unit of erase. Memory also cells can be grouped into blocks for other reasons, such as to organize the memory structure to enable the signaling and selection circuits.

In some embodiments, a block represents a groups of connected memory cells as the memory cells of a block share a common set of word lines. For example, the word lines for a block are all connected to all of the vertical NAND strings for that block. Although FIG. 4B shows four planes, more or less than four planes can be implemented. In some embodiments, memory structure 202 includes eight planes.

Each block typically is divided into one or more pages. In an embodiment, a page is a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line.

Figure 4C:
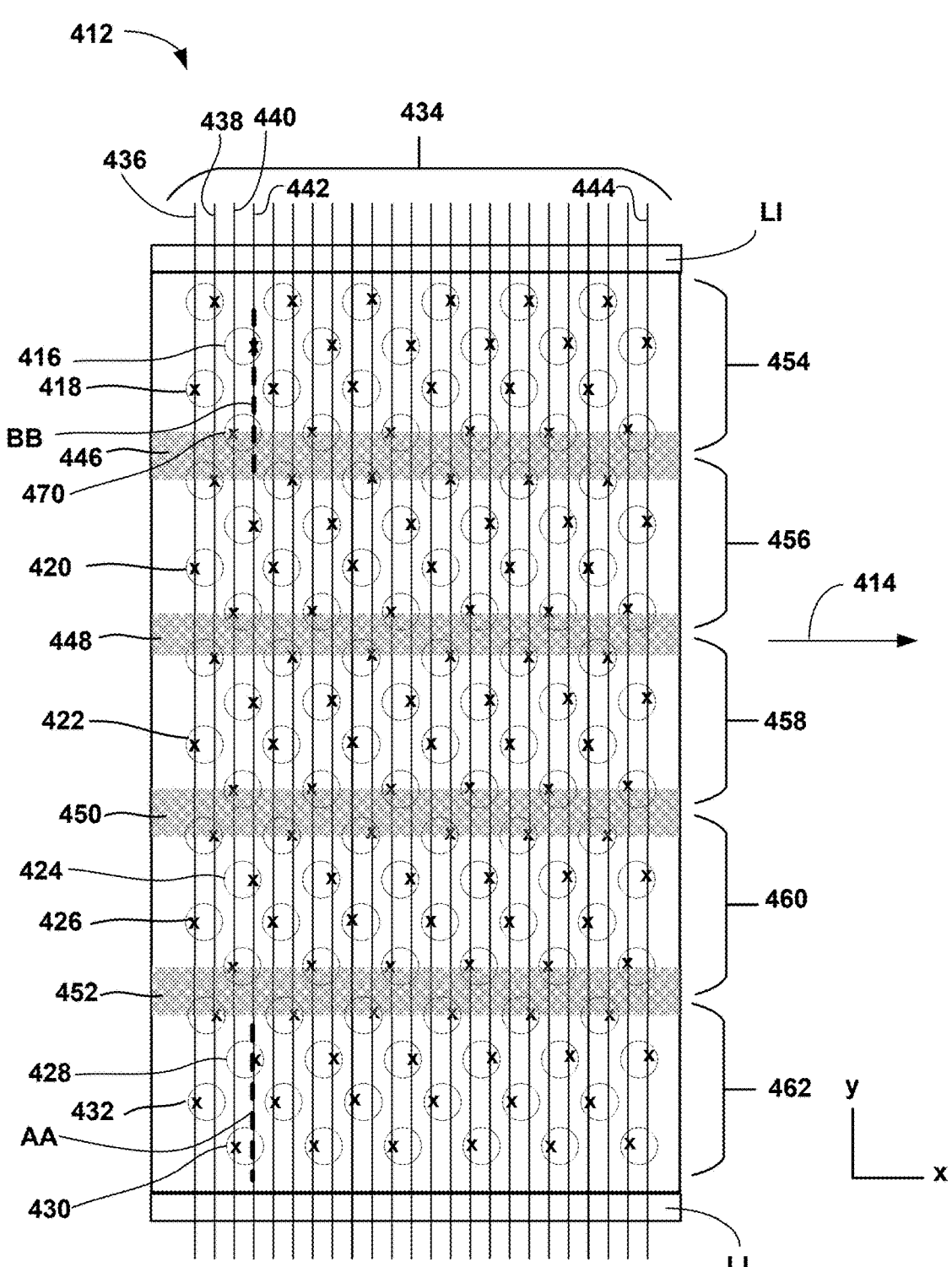
FIG. 4C depicts a top view of a portion of one embodiment of a block of memory cells.

FIGS. 4C-4I depict an example three dimensional ("3D") NAND structure that corresponds to the structure of FIG. 4A and can be used to implement memory structure 202 of FIGS. 2A and 2B. FIG. 4C is a block diagram depicting a top view of a portion 412 of Block 2 of plane 404. As can be seen from FIG. 4C, the block depicted in FIG. 4C extends in the direction of 414. In one embodiment, the memory array has many layers. However, FIG. 4C only shows the top layer.

FIG. 4C depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4C labels a subset of the memory holes/vertical columns/NAND strings 416, 418, 420, 422, 424, 426, 428, 430 and 432.

FIG. 4C also depicts a set of bit lines 434, including bit lines 436, 438, 440, 442, . . . 444. FIG. 4C shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 436 is connected to memory holes/vertical columns 418, 420, 422, 426 and 432.

The block depicted in FIG. 4C includes a set of isolation regions 446, 448, 450 and 452, which are formed of $SiO_2$. However, other dielectric materials also can be used. Isolation regions 446, 448, 450 and 452 serve to divide the top layers of the block into five regions For example, the top layer depicted in FIG. 4C is divided into regions 454, 456, 458, 460 and 462.

In an embodiment, the isolation regions only divide the layers used to implement select gates so that NAND strings in different regions can be independently selected. In one example implementation, a bit line connects to one memory hole/vertical column/NAND string in each of regions 454, 456, 458, 460 and 462. In that implementation, each block has twenty four rows of active columns and each bit line connects to five rows in each block.

In an embodiment, all of the five memory holes/vertical columns/NAND strings connected to a common bit line are connected to the same set of word lines. In an embodiment, the system uses the drain side selection lines to choose one (or another subset) of the five to be subjected to a memory operation (program, verify, read, and/or erase).

FIG. 4C also shows Line Interconnects LI, which are metal connections to the source line SL from above the memory array. Line Interconnects LI are positioned adjacent regions 454 and 462.

Although FIG. 4C shows each region 454, 456, 458, 460 and 462 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block.

FIG. 4C also shows the memory holes/vertical columns being staggered. In other embodiments, different patterns of staggering can be used. In some embodiments, the memory holes/vertical columns are not staggered.

Figure 4D:
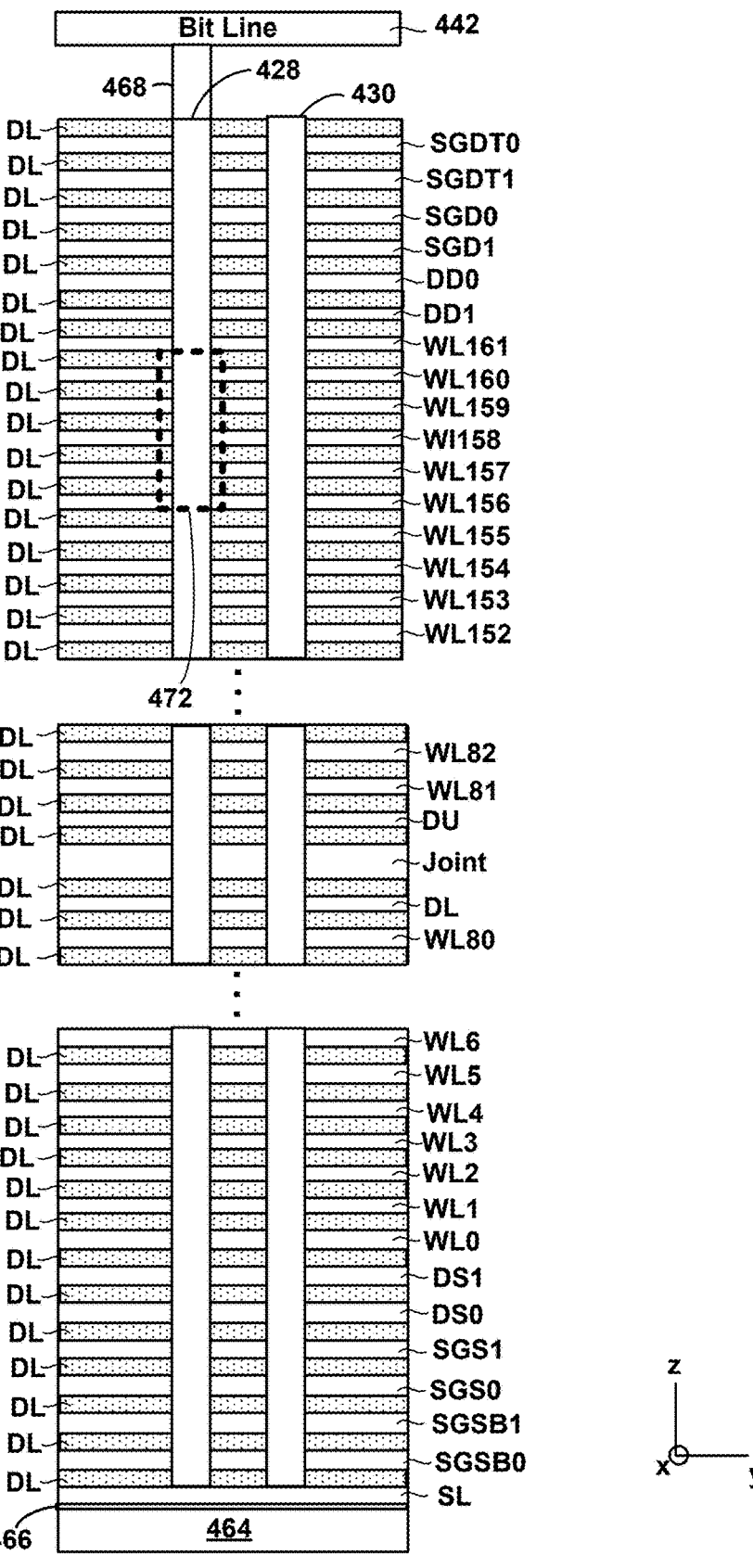
FIG. 4D depicts a cross sectional view of a portion of one embodiment of a block of memory cells.

FIG. 4D depicts a portion of one embodiment of a three dimensional memory structure 202 showing a cross-sectional view along line AA of FIG. 4C. This cross sectional view cuts through memory holes/vertical columns (NAND strings) 428 and 430 of region 462 (see FIG. 4C).

The structure of FIG. 4D includes two drain side select layers SGD0 and SGD1, two source side select layers SGS0 and SGS1, two drain side transistor layers SGDT0 and SGDT1, two source side transistor layers SGSB0 and SGSB1, two drain side dummy word line layers DD0 and DD1, two source side dummy word line layers DS0 and DS1, dummy word line layers DU and DL, one hundred and sixty two word line layers WL0-WL161 for connecting to data memory cells, and dielectric layers DL.

Other embodiments can implement more or less than the numbers described above for FIG. 4D. In one embodiment, SGD0 and SGD1 are connected together; and SGS0 and SGS1 are connected together. In other embodiments, more or less number of SGDs (greater or lesser than two) are connected together, and more or less number of SGS devices (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4D shows two GIDL generation transistors at each end of the NAND string. In other embodiments there may be more or less than two GIDL generation transistors at each end of the NAND string. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4D shows two GIDL generation transistors (SGDT0, SGDT1, SGSB0 and SGSB1) at each end of the NAND string. In an embodiment, charge carriers are only generated by GIDL at one of the two GIDL generation transistors at each end of the NAND string. In an embodiment, based on process variations during manufacturing one of the two GIDL generation transistors at an end of the NAND string is best suited for GIDL.

For example, the GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/vertical columns 428 and 430 are depicted protruding through the drain side select layers, source side select layers, dummy word line layers, GIDL generation transistor layers and word line layers. In an embodiment, each memory hole/vertical column includes a vertical NAND string. Below the memory holes/vertical columns and the layers listed below is substrate 464, an insulating film 466 on the substrate, and source line SL. The NAND string of memory hole/vertical column 428 has a source end at a bottom of the stack and a drain end at a top of the stack. As in FIG. 4C, FIG. 4D show vertical memory hole/column 428 connected to bit line 442 via connector 468.

For ease of reference, drain side select layers, source side select layers, dummy word line layers, GIDL generation transistor layers and data word line layers collectively are referred to as conductive layers.

In an embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). Dummy word line layers connect to dummy memory cells.

A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D shows that the memory array is implemented as a two tier architecture, with the tiers separated by a Joint Area. In some instances, etching so many word line layers intermixed with dielectric layers is expensive and/or challenging. To ease this burden, an embodiment includes laying down a first stack of word line layers (e.g., WL0-WL80) alternating with dielectric layers, laying down the Joint Area, and laying down a second stack of word line layers (e.g., WL81-WL161) alternating with dielectric layers. The Joint Area is positioned between the first stack and the second stack. In an embodiment, Joint Areas are made from the same materials as the word line layers. In other embodiments, there is no Joint Area or there can be multiple Joint Areas.

Figure 4E:
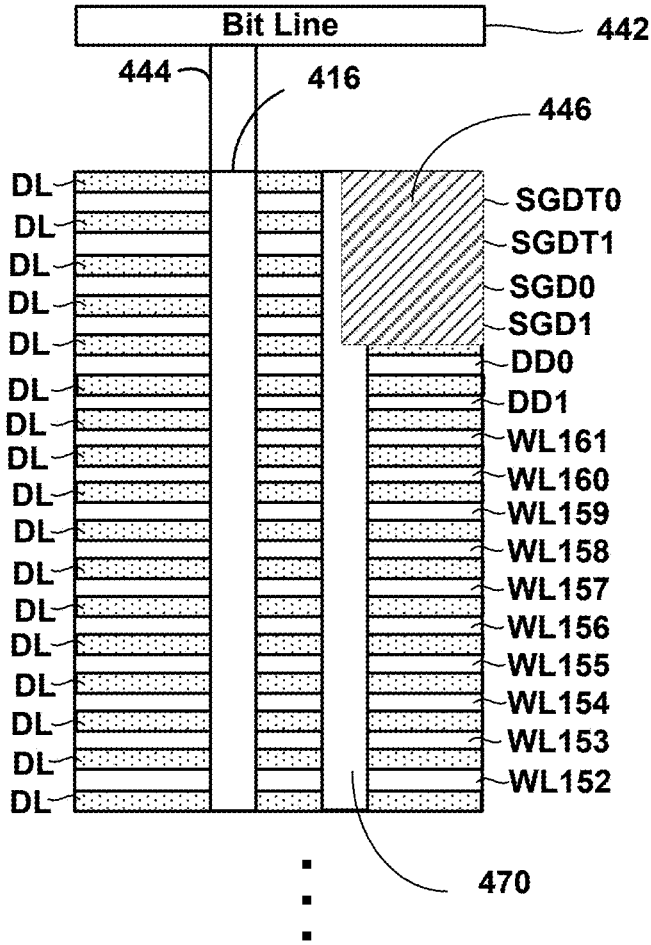
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4C. This cross sectional view cuts through memory holes/vertical columns (NAND strings) 416 and 470 of region 454 (see FIG. 4C). FIG. 4E shows the same alternating conductive and dielectric layers as FIG. 4D.

FIG. 4E also shows isolation region 446. Isolation regions 446, 448, 450 and 452) occupy space that would have been used for a portion of the memory holes/vertical columns/ NAND strings. For example, isolation region 446 occupies space that would have been used for a portion of memory hole/vertical column 470. More specifically, a portion (e.g., half the diameter) of vertical column 470 has been removed in layers SGDT0, SGDT1, SGD0, and SGD1 to accommodate isolation region 446.

Thus, although most of vertical column 470 is cylindrical (with a circular cross section), the portion of vertical column 470 in layers SGDT0, SGDT1, SGD0, and SGD1 has a semi-circular cross section. In an embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 454, 456, 458, 460, and 462.

Figure 4F:
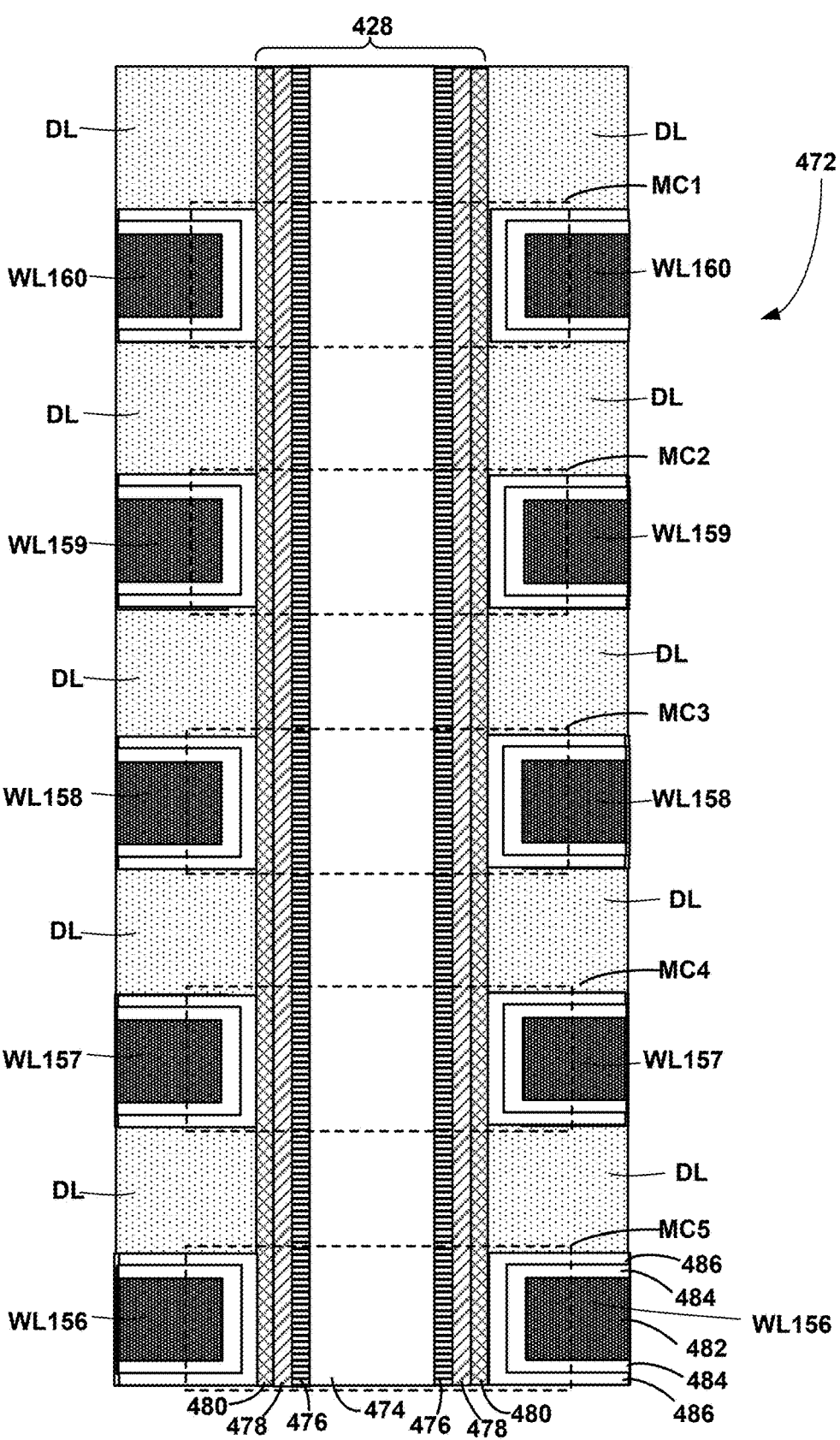
FIG. 4F is a cross sectional view of one embodiment of a vertical column of memory cells.

FIG. 4F depicts a cross sectional view of region 472 of FIG. 4D that includes a portion of memory hole/vertical column 428. In an embodiment, the memory holes/vertical columns are round. However, in other embodiments other shapes can be used. In an embodiment, memory hole/ vertical column 428 includes an inner core layer 474 that is made of a dielectric, such as $SiO_2$. Other materials can also be used.

Surrounding inner core 474 is polysilicon channel 476. Materials other than polysilicon can also be used. Note that it is the channel 476 that connects to the bit line and the source line. Surrounding channel 476 is a tunneling dielectric 478. In an embodiment, tunneling dielectric 478 has an ONO structure. Surrounding tunneling dielectric 478 is charge trapping layer 480, such as (for example) Silicon Nitride. Other memory materials and structures can also be used. The technology described herein is not limited to any particular material or structure.

FIG. 4F depicts dielectric layers DL as well as word line layers WL160, WL159, WL158, WL157, and WL156. Each of the word line layers includes a word line region 482 surrounded by an aluminum oxide layer 484, which is surrounded by a blocking oxide layer 486. In other embodiments, the blocking oxide layer can be a vertical layer parallel and adjacent to charge trapping layer 480. The physical interaction of the word line layers with the vertical column forms the memory cells. Thus, in an embodiment a memory cell includes channel 476, tunneling dielectric 478, charge trapping layer 480, blocking oxide layer 486, aluminum oxide layer 484 and word line region 482.

For example, word line layer WL160 and a portion of memory hole/vertical column 428 constitute a memory cell MC1. Word line layer WL159 and a portion of memory hole/vertical column 428 constitute a memory cell MC2. Word line layer WL158 and a portion of memory hole/ vertical column 428 constitute a memory cell MC3. Word line layer WL157 and a portion of memory hole/vertical column 428 constitute a memory cell MC4. Word line layer WL156 and a portion of memory hole/vertical column 428 constitute a memory cell MC5. In other architectures, a memory cell may have a different structure. However, the memory cell would still be the storage unit.

When a memory cell is programmed, electrons are stored in a portion of the charge trapping layer 480 which is associated with the memory cell. These electrons are drawn into the charge trapping layer 480 from the channel 476, through the tunneling dielectric 478, in response to an appropriate voltage on word line region 482. The threshold voltage (Vth) of a memory cell is increased in proportion to the amount of stored charge.

In an embodiment, the programming is achieved through Fowler-Nordheim tunneling of the electrons into the charge trapping layer. During an erase operation, the electrons return to the channel or holes are injected into the charge trapping layer to recombine with electrons. In an embodiment, erasing is achieved using hole injection into the charge trapping layer via a physical mechanism such as GIDL.

Figure 4G:
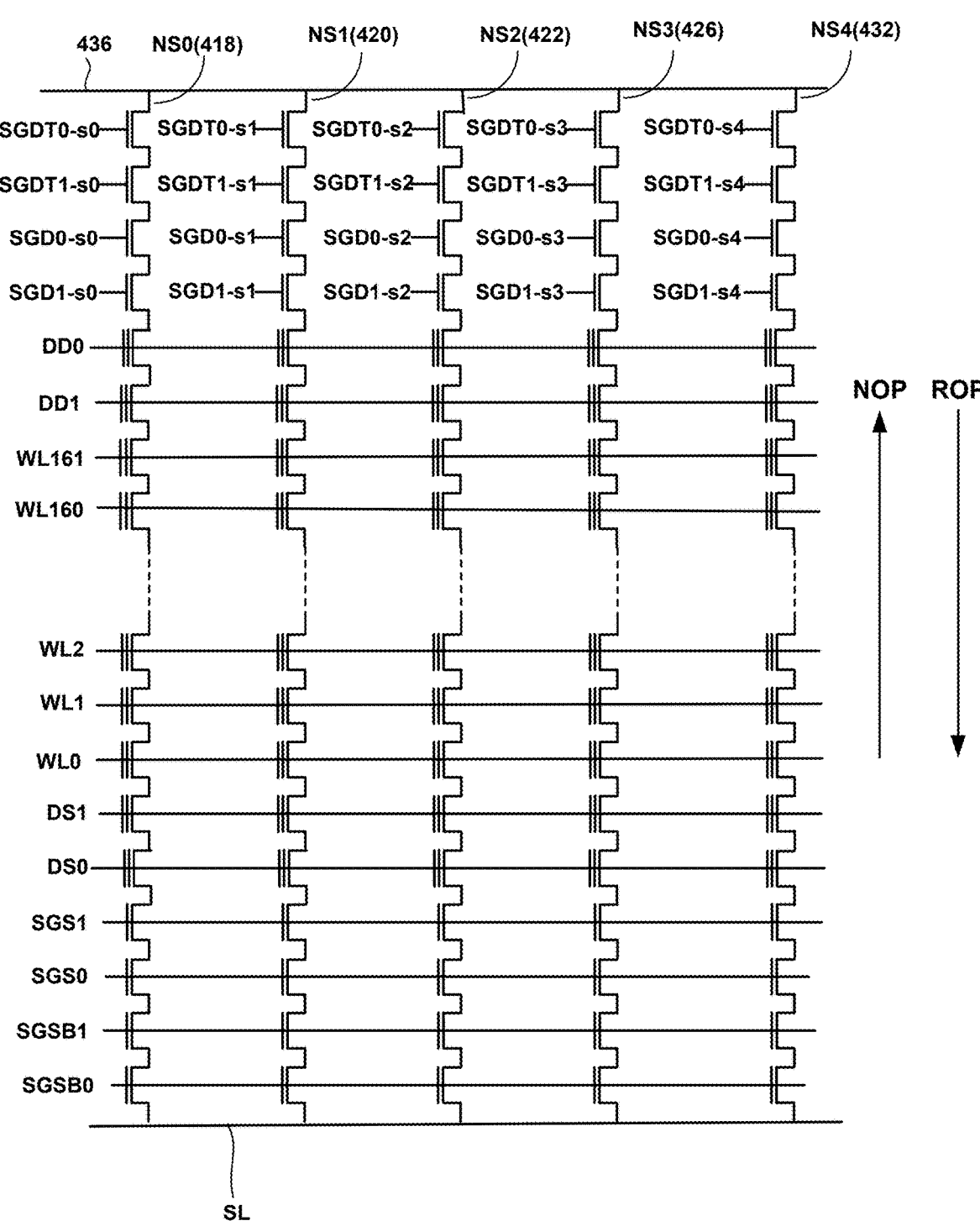
FIG. 4G is a schematic of a plurality of NAND strings in multiple regions of a same block.

FIG. 4G is a schematic diagram of a portion of the three dimensional memory array 202 depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in an embodiment each bit line is connected to five NAND strings, one in each of regions 454, 456, 458, 460, 462.

Thus, FIG. 4G shows bit line 436 connected to NAND string NS0 (which corresponds to memory hole/vertical column 418 of region 454), NAND string NS1 (which corresponds to memory hole/vertical column 420 of region 456), NAND string NS2 (which corresponds to vertical column 422 of region 458), NAND string NS3 (which corresponds to memory hole/vertical column 426 of region 460), and NAND string NS4 (which corresponds to memory hole/vertical column 432 of region 462).

Drain side select line/layer SGD0 is separated by isolation regions 446, 448, 450 and 452 to form SGD0-s0, SGD0-s1, SGD0-s2, SGD0-s3 and SGD0-s4 to separately connect to and independently control regions 454, 456, 458, 460, 462. Similarly, drain side select line/layer SGD1 is separated by isolation regions 446, 448, 450 and 452 to form SGD1-s0, SGD1-s1, SGD1-s2, SGD1-s3 and SGD1-s4 to separately connect to and independently control regions 454, 456, 458, 460, 462.

Drain side GIDL generation transistor control line/layer SGDT0 is separated by isolation regions 446, 448, 450 and 452 to form SGDT0-s0, SGDT0-s1, SGDT0-s2, SGDT0-s3 and SGDT0-s4 to separately connect to and independently control regions 454, 456, 458, 460, 462.

Drain side GIDL generation transistor control line/layer SGDT1 is separated by isolation regions 446, 448, 450 and 452 to form SGDT1-s0, SGDT1-s1, SGDT1-s2, SGDT1-s3 and SGDT1-s4 to separately connect to and independently control regions 454, 456, 458, 460, 462.

Each set of drain side select lines SGD0-s0 and SGD1-s0, SGD0-s1 and SGD1-s1, SGD0-s2 and SGD1-s2, SGD0-s3 and SGD1-s3, and SGD0-s4 and SGD1-s4 can be independently selected of the others. Each set of drain side select lines SGD0-s0 and SGD1-s0, SGD0-s1 and SGD1-s1, SGD0-s2 and SGD1-s2, SGD0-s3 and SGD1-s3, and SGD0-s4 and SGD1-s4 connects to a group of NAND strings in the block. Only one NAND string of each group is depicted in FIG. 4G. These four sets of drain side select lines correspond to four sub-blocks.

A first sub-block corresponds to those vertical NAND strings controlled by the set of drain side select lines SGD0-s0 and SGD1-s0. A second sub-block corresponds to those vertical NAND strings controlled by the set of drain side select lines SGD0-s1 and SGD1-s1. A third sub-block corresponds to those vertical NAND strings controlled by the set of drain side select lines SGD0-s2 and SGD1-s2. A fourth sub-block corresponds to those vertical NAND strings controlled by the set of drain side select lines SGD0-s3 and SGD1-s3. A fifth sub-block corresponds to those vertical NAND strings controlled by the set of drain side select lines SGD0-s4 and SGD1-s4. FIG. 4G only shows NAND strings connected to bit line 436. However, a full schematic of the block would show every bit line and five vertical NAND strings (that are in separate regions) connected to each bit line.

Figure 4H:
FIG. 4H depicts a cross-sectional view of a portion of a block that includes four string sub-blocks.
Figure 4H:
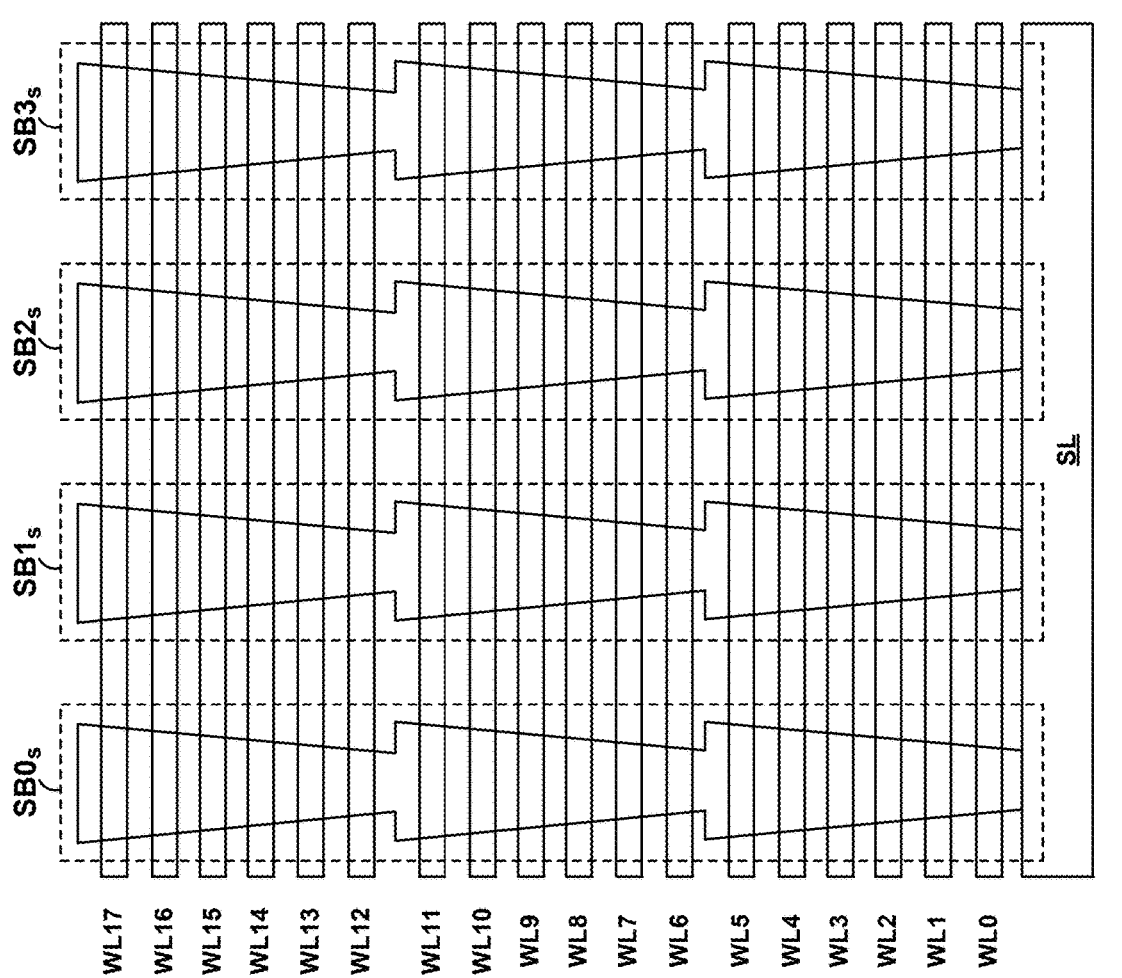

The sub-blocks depicted in FIG. 4G are sometimes referred to as "string sub-blocks," because each sub-block includes one (or more) NAND strings. For example, FIG. 4H depicts a cross-sectional view of a portion of a block 488 that includes four string sub-blocks SB0$_s$, SB1$_s$, SB2$_s$ and SB3$_s$. In the depicted example, word lines WL0, WL1, WL2, . . . , WL17 are coupled to all four string sub-blocks SB0$_s$, SB1$_s$, SB2$_s$ and SB3$_s$. In some embodiments, string sub-blocks SB0$_s$, SB1$_s$, SB2$_s$ and SB3$_s$ may be erased independently. Persons of ordinary skill in the art will understand that a block may include more or fewer than four string sub-blocks.

Figure 4I:
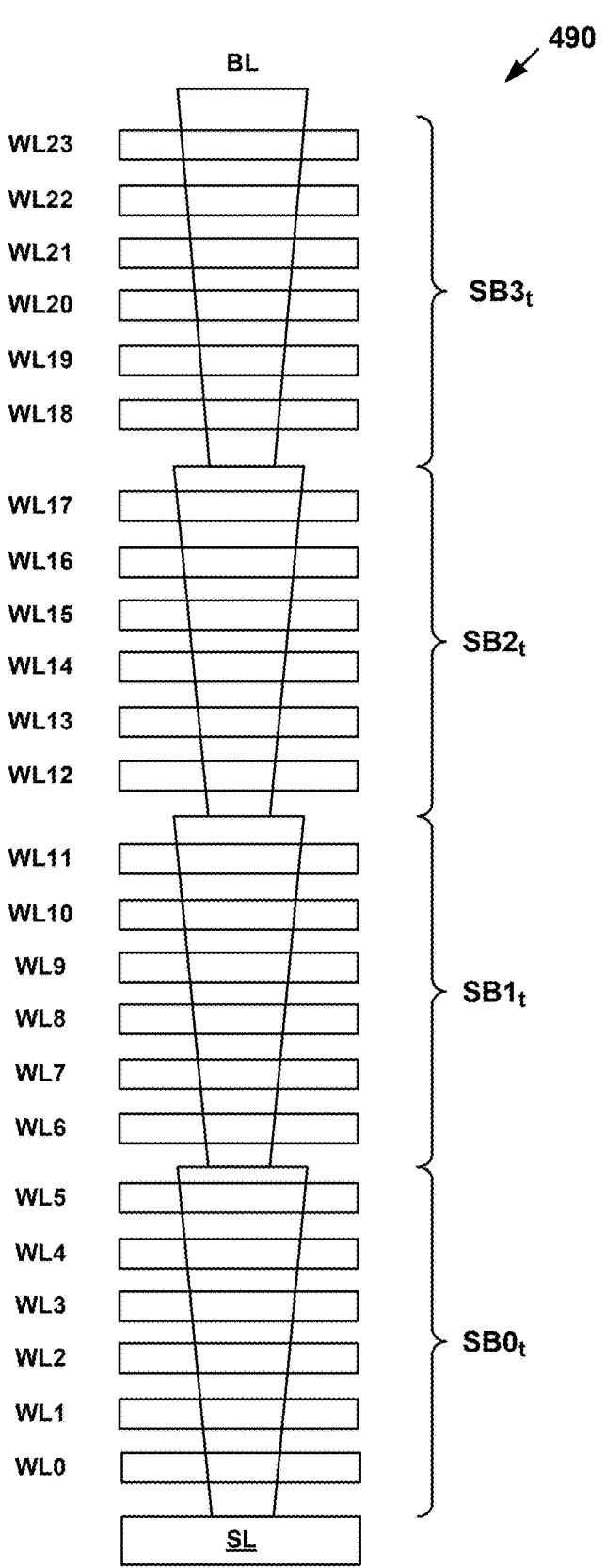
FIG. 4I depicts a cross-sectional view of a portion of a block that includes four tier sub-blocks.

In some embodiments, a block is divided into two or more sub-block tiers, each of which contains a subset of word lines of the block. Such an arrangement is sometimes referred to as "tier sub-blocks." For example, FIG. 4I depicts a cross-sectional view of a portion of a block 490 that includes four tier sub-blocks SB0$_t$, SB1$_t$, SB2$_t$ and SB3$_t$. In the depicted example, tier sub-block SB0$_t$ includes word lines WL0, WL1, . . . , WL5, tier sub-block SB1$_t$ includes word lines WL6, WL7, . . . , WL11, tier sub-block SB2$_t$ includes word lines WL12, WL13, . . . , WL17, and tier sub-block SB3$_t$ includes word lines WL18, WL19, . . . , WL23. In some embodiments, tier sub-blocks SB0$_t$, SB1$_t$, SB2$_t$ and SB3$_t$ may be erased independently. Persons of ordinary skill in the art will understand that a block may include more or fewer than four tier sub-blocks.

Although the example memories of FIGS. 4B-4I are three dimensional memory structures that include vertical NAND strings with charge-trapping material, other (2D and 3D) memory structures also can be used with the technology described herein.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate.

Figure 5A:
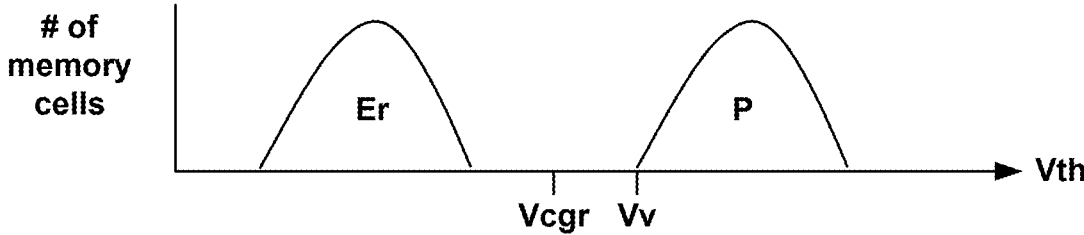
FIGS. 5A-5D are diagrams each depicting example threshold voltage distributions.

FIG. 5A is a diagram of example threshold voltage versus number of memory cells, and illustrates example threshold voltage distributions for the memory array when each memory cell stores one bit of data per memory cell. Memory cells that store one bit of data per memory cell data are referred to as single level cells ("SLC").

FIG. 5A shows two threshold voltage distributions: Er and P. Threshold voltage distribution Er corresponds to an erased data state, and threshold voltage distribution P corresponds to a programmed data state. Memory cells that have threshold voltages in threshold voltage distribution Er are in the erased data state. Memory cells that have threshold voltages in threshold voltage distribution P are in the programmed data state.

In an embodiment, erased memory cells store data "1" and programmed memory cells store data "0." FIG. 5A depicts read reference voltage VCGR. By testing (e.g., performing one or more sense operations) whether the threshold voltage of a given memory cell is above or below VCGR, the system can determine whether a memory cells is erased (state Er) or programmed (state P). FIG. 5A also depicts verify reference voltage Vv. In some embodiments, when programming memory cells to data state P, the system will test whether those memory cells have a threshold voltage greater than or equal to Vv.

In general, during read operations, a selected word line is connected to read reference voltage VCGR, and a conduction current of the memory cell is measured to determine whether the memory cell turned ON (conducted current) in response to the voltage applied to the word line. If the conduction current is measured to be greater than a certain value, then it is assumed that the memory cell turned ON and the threshold voltage of the memory cell is less than the voltage applied to the word line.

In contrast, if the conduction current is not measured to be greater than the certain value, then it is assumed that the memory cell did not turn ON and the threshold voltage of the memory cell is greater than the voltage applied to the word line. During a read process, unselected memory cells are provided with a read pass voltage VREAD (also referred to as a bypass voltage) at their control gates so that these memory cells will operate as pass gates (e.g., conducting current regardless of whether they are programmed or erased).

Figure 5B:
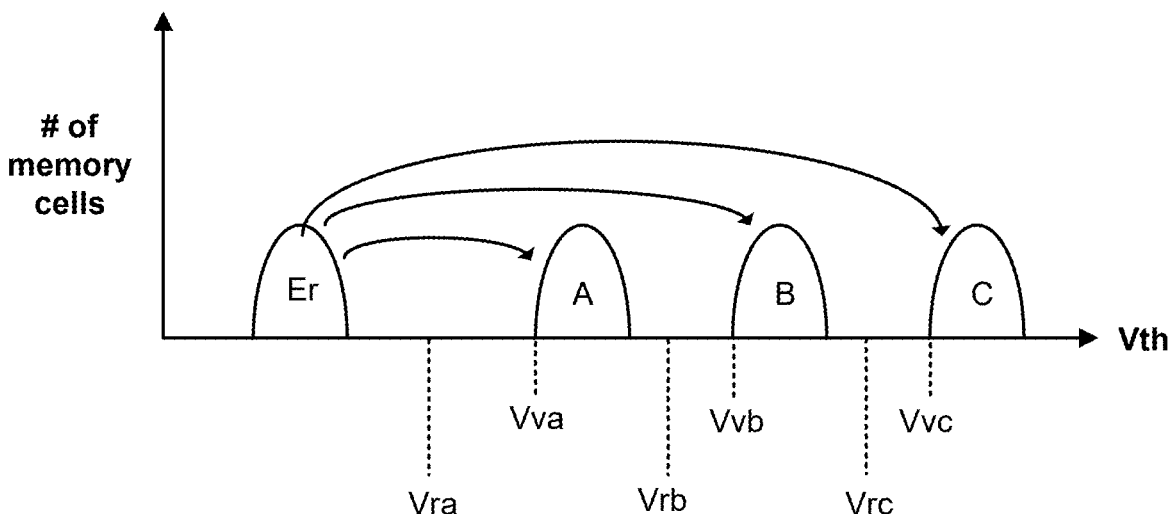
Figures 5C, 5D:
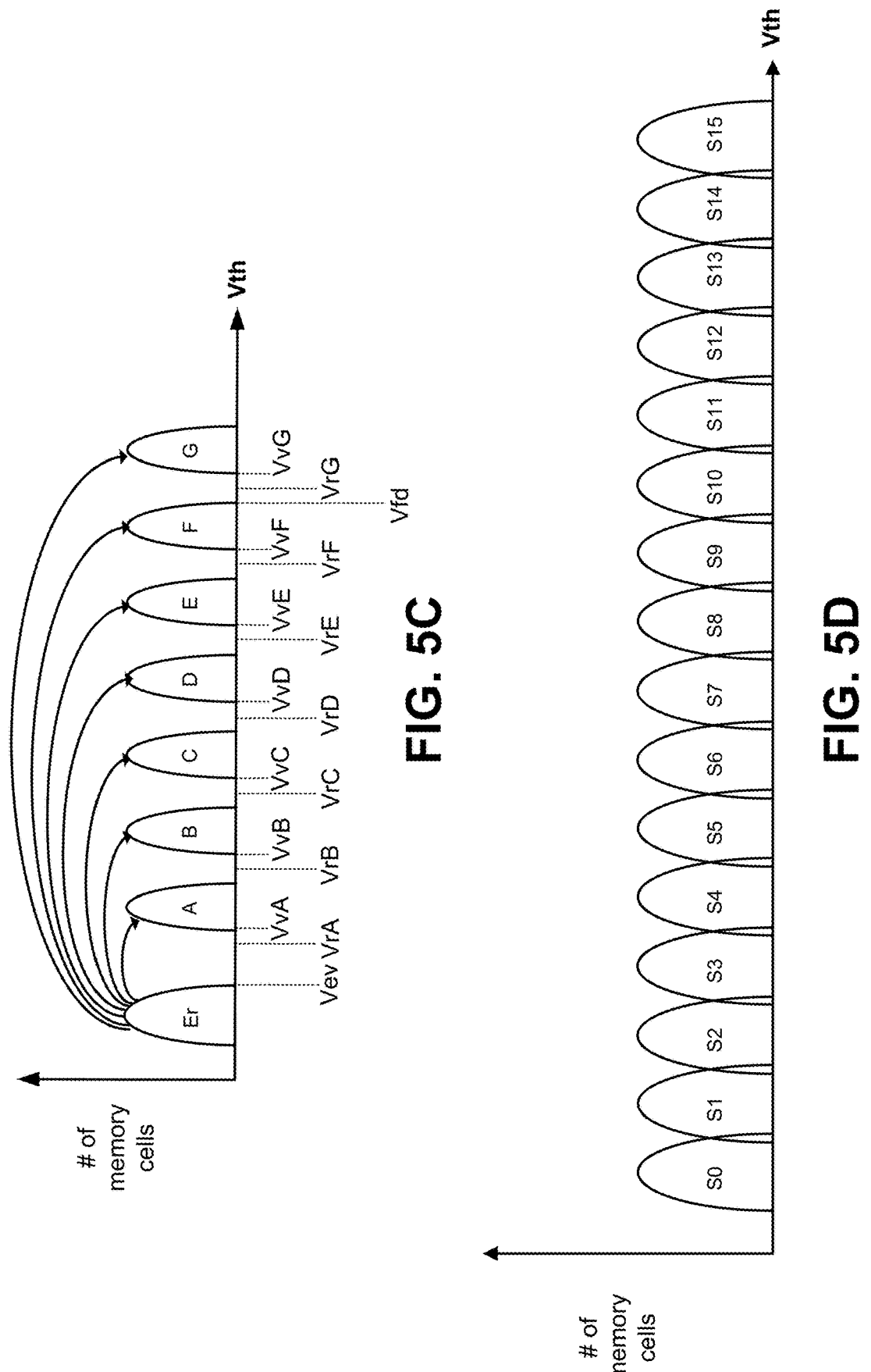

FIGS. 5B-D illustrate example threshold voltage distributions for a memory array in which each memory cell stores multiple bit per memory cell data. Memory cells that store multiple bit per memory cell data are referred to as multi-level cells (MLC). The data stored in MLC memory cells are referred to as MLC data. In the example embodiment of FIG. 5B, each memory cell stores two bits of data. Other embodiments may use other data capacities per memory cell (e.g., such as three, four, or five or more bits of data per memory cell).

FIG. 5B shows a first threshold voltage distribution Er for erased memory cells. Three threshold voltage distributions A, B and C for programmed memory cells also are depicted. In an embodiment, the threshold voltages in the distribution Er are negative and the threshold voltages in distributions A, B and C are positive. Each distinct threshold voltage distribution of FIG. 5B corresponds to predetermined values for the set of data bits.

In an embodiment, the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|  | Er | A | B | C |
|---|---|---|---|---|
| LP | 1 | 0 | 0 | 1 |
| UP | 1 | 1 | 0 | 0 |

In an embodiment, known as full sequence programming, memory cells can be programmed from the erased data state Er directly to any of the programmed data states A, B or C. For example, a population of memory cells to be programmed may first be erased so that all memory cells in the population are in erased data state Er. Then, a programming process is used to program memory cells directly into data states A, B, and/or C.

For example, while some memory cells are being programmed from erased data state Er to data state A, other memory cells are being programmed from erased data state Er to data state B and/or from erased data state Er to data state C. The arrows of FIG. 5B represent full sequence programming. In some embodiments, data states A-C can overlap, with memory controller 104 (or control die 244) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (erased data state) Er represents memory cells that are erased. The other seven threshold voltage distributions (data states) A-G represent memory cells that are programmed and, therefore, also are called programmed states.

Each threshold voltage distribution (data state) corresponds to predetermined values for the set of data bits. The specific relationship between the data programmed into the memory cell and the threshold voltage levels of the cell depends upon the data encoding scheme adopted for the cells.

In an embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|  | Er | A | B | C | D | E | F | G |
|---|---|---|---|---|---|---|---|---|
| LP | 1 | 1 | 1 | 0 | 0 | 0 | 0 | 1 |
| MP | 1 | 1 | 0 | 0 | 1 | 1 | 0 | 0 |
| UP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (e.g., A, B, C, D, . . . ) a memory cell is in.

FIG. 5C also shows seven verify reference voltages, VvA, VvB, VvC, VvD, VvE, VvF, and VvG. In some embodiments, when programming memory cells to data states A, B, C, D, E, F and G, the system will test whether those memory cells have a threshold voltage greater than or equal to VvA, VvB, VvC, VvD, VVE, VvF and VvG, respectively. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G.

For example, while some memory cells are being programmed from erased data state Er to data state A, other memory cells are being programmed from erased data state Er to data state B and/or from erased data state Er to data state C, and so on. The arrows of FIG. 5C represent the full sequence programming. In some embodiments, data states A-G can overlap, with memory controller 1204 and/or control die 244 relying on error correction to identify the correct data being stored. In some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) to determine whether a threshold voltage of the concerned memory cell has reached such level.

After applying the word line voltage, the conduction current of the memory cell is measured to determine whether the memory cell turned ON (conducted current) in response to the voltage applied to the word line. If the conduction current is measured to be greater than a certain value, then it is assumed that the memory cell turned ON and the voltage applied to the word line is greater than the threshold voltage of the memory cell.

If the conduction current is not measured to be greater than the certain value, then it is assumed that the memory example of MLC data. FIG. 5D depicts that there may be some overlap between the threshold voltage distributions (data states) S0-S15. The overlap may occur due to factors such as memory cells losing charge (and hence dropping in threshold voltage).

Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities.

In some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits.

The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   | cell did not turn ON and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. The technology described herein can be used with different methods known in the art for verifying/reading. Other read and verify techniques known in the art can also be used.

Figure 6:
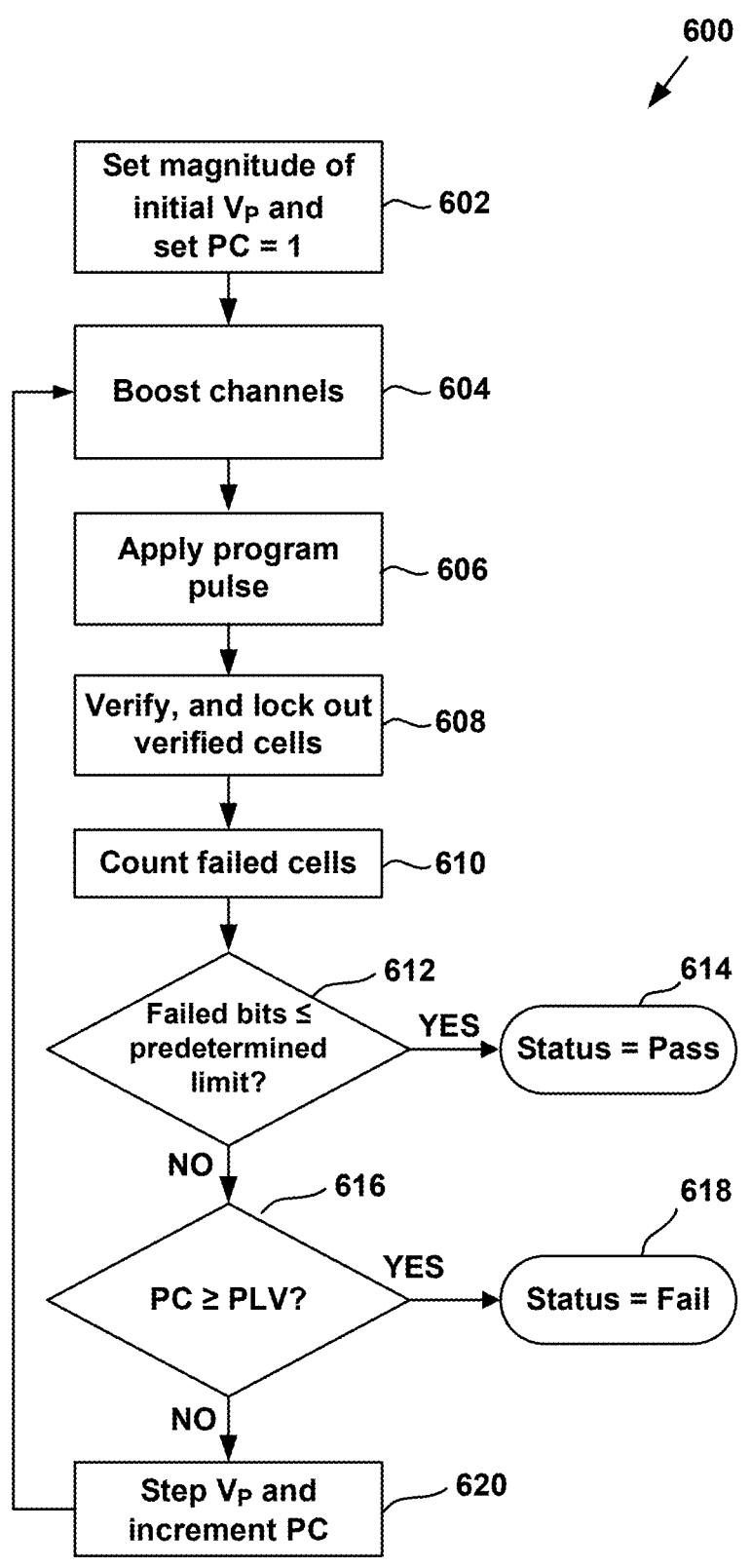
FIG. 6 is a flowchart describing an embodiment of a process for programming non-volatile memory.

FIG. 5D depicts threshold voltage distributions when each memory cell stores four bits of data, which is another FIG. 6 is a flowchart describing an embodiment of a process 600 for programming a memory cell. In an example embodiment, process 600 is performed on memory die 106 (FIG. 1), memory die 200 (FIG. 2B) or memory die 242 (FIG. 2B) using the control circuits discussed above. For example, process 600 can be performed at the direction of state machine 228 (FIGS. 2A-2B).

In an embodiment, process 600 includes multiple loops, each of which includes a program phase and a verify phase. In an embodiment, process 600 also can be used to implement the full sequence programming discussed above. Additionally, process 600 can be used to implement each phase of a multi-phase programming process. In an embodiment, when implementing multi-phase programming, process 600 is used to implement any/each stage of the multi-phase programming process.

In an embodiment, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size.

In step 602, a programming voltage ($V_P$) is initialized to a starting program voltage $V_{Pinit}$ (e.g., between about 12V to about 20V, or some other value) and a program counter PC maintained by state machine 228 is initialized at 1.

In an embodiment, a group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line also will be connected to memory cells that are supposed to be inhibited from programming.

Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

In step 604, NAND strings that include memory cells connected to the selected word line that are to be inhibited from programming have their channels boosted to inhibit programming. Such NAND strings are referred to herein as "unselected NAND strings." In an embodiment, the unselected word lines receive one or more boosting voltages (e.g., ~7-11 V) to perform boosting schemes. A program inhibit voltage is applied to the bit lines coupled the unselected NAND string.

In step 606, a program pulse having a magnitude $V_P$ is applied to the selected word line. In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to an inhibit voltage (e.g., Vpass) (e.g., 10V) to inhibit programming.

In step 608, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 608, the memory cells are verified using the appropriate set of verify reference voltages to perform one or more verify operations. In an embodiment, the verify step includes testing whether memory cells being programmed have successfully reached their target data state. In an embodiment, memory cells that have reached their target states are locked out from further programming. In an embodiment, step 608 is performed by testing whether the threshold voltages of the memory cells selected for programming have reached the appropriate verify reference voltage.

In step 610, the memory system counts the number of memory cells that have not yet reached their respective target threshold voltage distribution. That is, the system counts the number of memory cells that have so far failed the verify process. This counting can be done by controller 104 (FIG. 1), state machine 228 (FIGS. 2A-2B), control die 244 (FIG. 2B), or other logic. In the remaining discussion, the term "Controller Device" may be one or more of controller 104 (FIG. 1), state machine 228 (FIGS. 2A-2B), control die 244 (FIG. 2B) or other similar controller device.

In an embodiment, each of sense amps 218 (FIG. 2A) stores the status (pass/fail) of their respective memory cells. In an embodiment, one total count reflects the total number of memory cells currently being programmed that have failed the last verify step. In another embodiment, separate counts are kept for each data state.

In step 612, a determination is made whether the count from step 610 is less than or equal to a predetermined limit. In an embodiment, the predetermined limit is the number of bits that can be corrected by error correction codes (ECC) during a read process for the page of memory cells.

If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process.

In some embodiments, the predetermined limit used in step 614 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 616 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 618.

If the program counter PC is not greater than or equal to program limit value PLV, then the process continues at step 620 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 600 then loops back to step 604, channels of NAND strings that include memory cells connected to the selected word line that are to be inhibited from programming are boosted to inhibit programming, and at step 606 another program pulse is applied to the selected word line so that another iteration (steps 604-620) of programming process 600 is performed. Each pass through steps 604-620 is referred to herein as a "program loop."

Referring again to FIG. 4G, in an embodiment the word lines of a memory block are programmed in a sequential order, which can proceed in two different and opposite directions. In an embodiment (indicated with the arrow pointing upward), sometimes referred to as a normal order programming (NOP), the word lines are programmed in sequence starting from a source side of the memory block and proceeding towards a drain side of the memory block.

In another embodiment, (indicated with the arrow pointing downward), sometimes referred to as a reverse order programming (ROP), the word lines are programmed in sequence starting from a drain side of the memory block and proceeding towards a source side of the memory block.

In general, during verify operations and read operations, the selected word line is connected to a voltage (one example of a reference signal), a level of which is specified for each read operation (e.g., read compare levels VrA, VrB, VrC, VrD, VrE, VrF, and VrG, of FIG. 5C) or verify operation (e.g. verify target levels VvA, VvB, VvC, VvD, VvE, VVF, and VvG of FIG. 5C) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a reference value, then it is assumed that the memory cell turned ON and the voltage applied to the word line is greater than the threshold voltage of the memory cell.

If the conduction current is measured to be not greater than the reference value, then the memory cell did not turn ON and the voltage applied to the word line is not greater than the threshold voltage of the memory cell. During a read or verify process, the unselected memory cells are provided with one or more read pass voltages Vread (e.g., 7V) (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 606 a program pulse is applied to the selected word line, and at step 608 memory cells coupled to the selected word line are verified using an appropriate set of verify reference voltages to perform one or more verify operations. Steps 606 and 608 are part of an iterative loop in which program pulses are applied as a series of program pulses that step up in magnitude, with intervening verify reference pulses between consecutive program pulses. Such an iterative loop is referred to herein as a "program-verify iteration."

Figure 7:
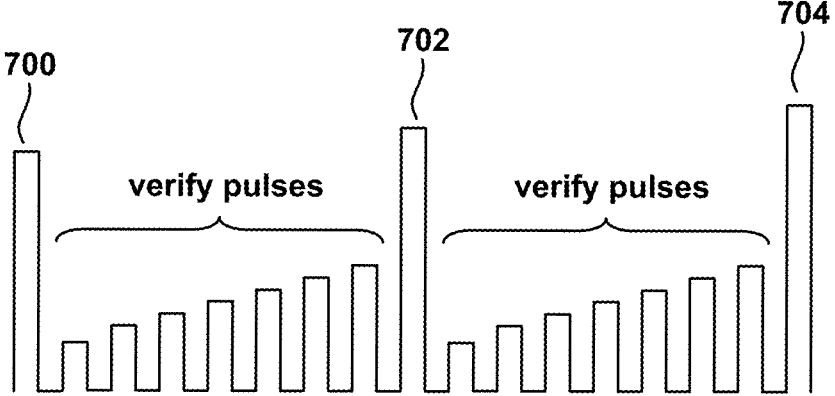
FIG. 7 depicts a word line voltage during programming and verify operations.

FIG. 7 illustrates an example of such program-verify pulses applied to a selected word line. In particular, FIG. 7 depicts program pulses 700, 702 and 704 applied to the selected word line during three successive iterations of step 606 of FIG. 6. Between program pulses 700, 702 and 704 verify pulses are applied to the selected word line during three successive program-verify iterations of steps 606-608 of FIG. 6 to determine whether threshold voltages of the memory cells are greater than the respective verify reference voltages.

In an embodiment, memory cells are erased prior to programming. Erasing is the process of changing the threshold voltage of one or more memory cells from a programmed data state to an erased data state. For example, changing the threshold voltage of one or more memory cells from state P to state Er of FIG. 5A, from states A/B/C to state Er of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate a gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage of memory cells.

In an embodiment, GIDL current is generated by causing a drain-to-gate voltage at a GIDL generation transistor (e.g., transistors connected to SGDT0, SGDT1, SGSB0, and SGSB1 in FIG. 4G). In some embodiments, a select gate (e.g., SGD or SGS) can be used as a GIDL generation transistor. A transistor drain-to-gate voltage that generates a GIDL current is referred to herein as a GIDL voltage.

A GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation.

In an embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, holes may tunnel from the channel to a charge storage region of the memory cells (e.g., to charge trapping layer 480) and recombine with electrons there, to lower the threshold voltage of the memory cells.

GIDL current may be generated at either end (or both ends) of a NAND string. In an embodiment, a first GIDL voltage may be created between two terminals of a GIDL generation transistor (e.g., connected to SGDT0, SGDT1) that is connected to or near a bit line to generate a first GIDL current. In an embodiment, a second GIDL voltage may be created between two terminals of a GIDL generation transistor (e.g., SGSB0, SGSB1) that is connected to or near a source line to generate a second GIDL current.

Erasing based on GIDL current at only one end of the NAND string is referred to as a one-sided GIDL erase. Erasing based on GIDL current at both ends of the NAND string is referred to as a two-sided GIDL erase.

As described above, in embodiments a population of memory cells to be programmed is first erased so that all memory cells in the population are in an erased data state (e.g., state Er in FIGS. 5A-5C or state S0 in FIG. 5D) prior to programming. When the programmed memory cells are subsequently selected to be re-programmed, the memory cells are again erased prior to programming.

This becomes cumbersome as the number of word lines in a memory block increases. Thus, in some memory devices memory blocks are subdivided into two or more sub-blocks. Indeed, as described above and depicted in FIGS. 4G-4I in some embodiments blocks can be divided into sub-blocks and sub-blocks can be programmed and erased independently of one another.

In an embodiment, after a read or program verify operation, voltages of all word lines are ramped down (e.g., to 0V) prior to a programming operation. In sub-block mode, residual electrons may become trapped in the channel of the unselected sub-blocks, and these residual electrons may disturb threshold voltages of unselected memory cells.

In particular, some memory cells in an unselected sub-block may have a low threshold voltage, in which the channel has a lot of electrons. That is, memory cells that have a low threshold voltage remain ON while the word lines are being ramped down and yet are still above the threshold voltages of the low threshold voltage memory cells. A memory cell that is conductive (i.e., has a threshold voltage below the word line voltage) still has electrons in the adjacent channel.

If a neighbor memory cell in the unselected sub-block has a higher threshold voltage, when the word line voltages ramp down all of the electrons in the channel cannot flow out because the neighbor cell cuts off the channel. In other words, when the word line voltage on the neighbor cell drops below the threshold voltage of the neighbor cell, the neighbor cell becomes non-conductive and the electrons in the channel of the adjacent cell cannot escape.

In this scenario, even if all of the word lines ramp down to 0V, the channel potential is still negative. In such a scenario, in the subsequent programming operation, the channel is in a negative condition, which is not good to prevent program disturb in an unselected sub-block.

In particular, in the program operation for an inhibited sub-block, suppose the word line bias start at 0V. If the channel potential also starts at 0V, and the Vpass=10V, then the boosting potential is about 10V. But if the channel potential starts at −5V, then the Vpass=10V can only bring the channel potential to +5V. If program voltage $V_P$=+20V, then there is a 15V difference between the program voltage and the channel voltage, which is enough to cause sub-block program disturb. To avoid such sub-block program disturb it is desirable to either bring the channel potential back to zero, or preferably to a positive potential.

One technique to address this issue uses a pre-charge step prior to a programming operation. In an embodiment, prior to each programming pulse, NAND string channels may be pre-charged by applying a small voltage to all of the word lines in a memory block to open the channels.

Figure 8:
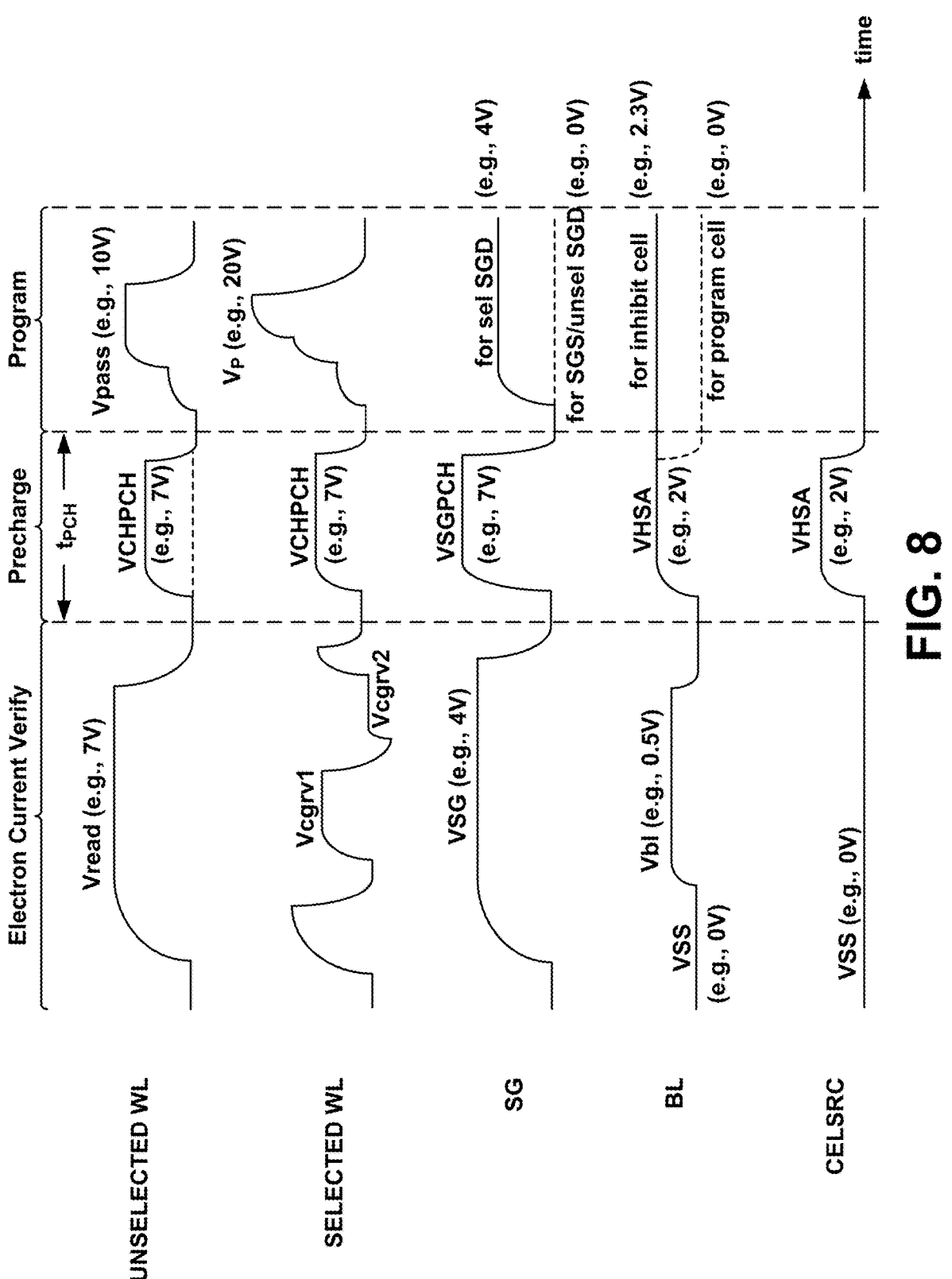
FIG. 8 depicts example voltages applied to various components of a memory block versus time during a verify operation of one program loop and a pre-charge and program operation of the following loop.

FIG. 8 depicts example voltages applied to various components of a memory block versus time during a verify operation of one program loop and a pre-charge and program operation of the following loop.

In an embodiment, during the verify operation one or more verify voltage levels (e.g., vcgrv1 and vegrv2) are applied to the selected word lines, a read pass voltage Vread (e.g., 7V) is applied to unselected word lines, a select gate voltage VSG (e.g., 4V) is applied to the drain and source side select gates, the selected bit line voltage is increased to a bit line voltage Vbl (e.g., 0.5V), and the source line potential is held at VSS (e.g., 0V).

If the threshold voltage of the selected memory cell is greater than a verify voltage Vcgv (e.g., vcgrv1 or vcgrv2) applied to the selected word line, then the selected memory cell will not turn ON. That is, an (electron) conduction current above a reference value is not detected in the NAND string.

In contrast, if the threshold voltage of the selected memory cell is below a verify voltage Vcgv (e.g., vcgrv1 or vcgrv2) applied to the selected word line, then the selected memory cell will turn ON. That is, an (electron) conduction current above a reference value is detected in the NAND string.

In an embodiment, at the end of the verify operation the voltages applied to the control gates of all word lines (selected and unselected word lines) ramp down simultaneously.

Next, during the pre-charge operation, a pre-charge voltage VCHPCH (e.g., 7V) is applied to the control gates of all word lines of the memory block (selected and unselected word lines). Simultaneously, a CELSRC voltage VHSA (e.g., 2V) is applied to the source line to introduce holes into the channel to clean the channel and charge the channel to approximately the VHSA voltage level.

For example, if a word line is coupled to a memory cell that is programmed with a high threshold voltage, after the word line ramps down to 0V the channel potential is still negative (e.g., −5V), which blocks the electron discharge. Without wanting to be bound by any particular theory, it is believed that the pre-charge operation injects holes into the channel, which brings the channel potential back up to 0V or even a positive voltage. Without wanting to be bound by any particular theory, it is believed that all of the electrons that had been trapped in the channel are recombined.

Without wanting to be bound by any particular theory, it is believed that pre-charging the channel mitigates the occurrence of program disturb (unintentional programming) in memory cells being inhibited during the following programming loop. In an embodiment, following the pre-charge operation a program operation is performed, such as described above in FIG. 6.

It is believed that the pre-charge operation of FIG. 8 is effective to increase the channel potential to a positive value by introducing holes into the channel. Without wanting to be bound by any particular theory it is believed that the example pre-charge operation depicted in FIG. 8 may eliminate the sub-block disturb issue.

However, the time required for the pre-charge operation (depicted as $t_{PCH}$ in FIG. 8) necessarily increases program time, particularly because the additional time $t_{PCH}$ is included in each program-verify iteration. Thus, it would be desirable to eliminate the sub-block disturb issue without including a pre-charge step prior to each program operation.

Technology is described that uses a hole-current verify operation prior to a program operation, with no pre-charge step between the verify operation and the program operation. As described in more detail below, the verify operation increases the channel potential to a positive value by introducing holes into the channel, and eliminates the need for a separate pre-charge step.

Figure 9:
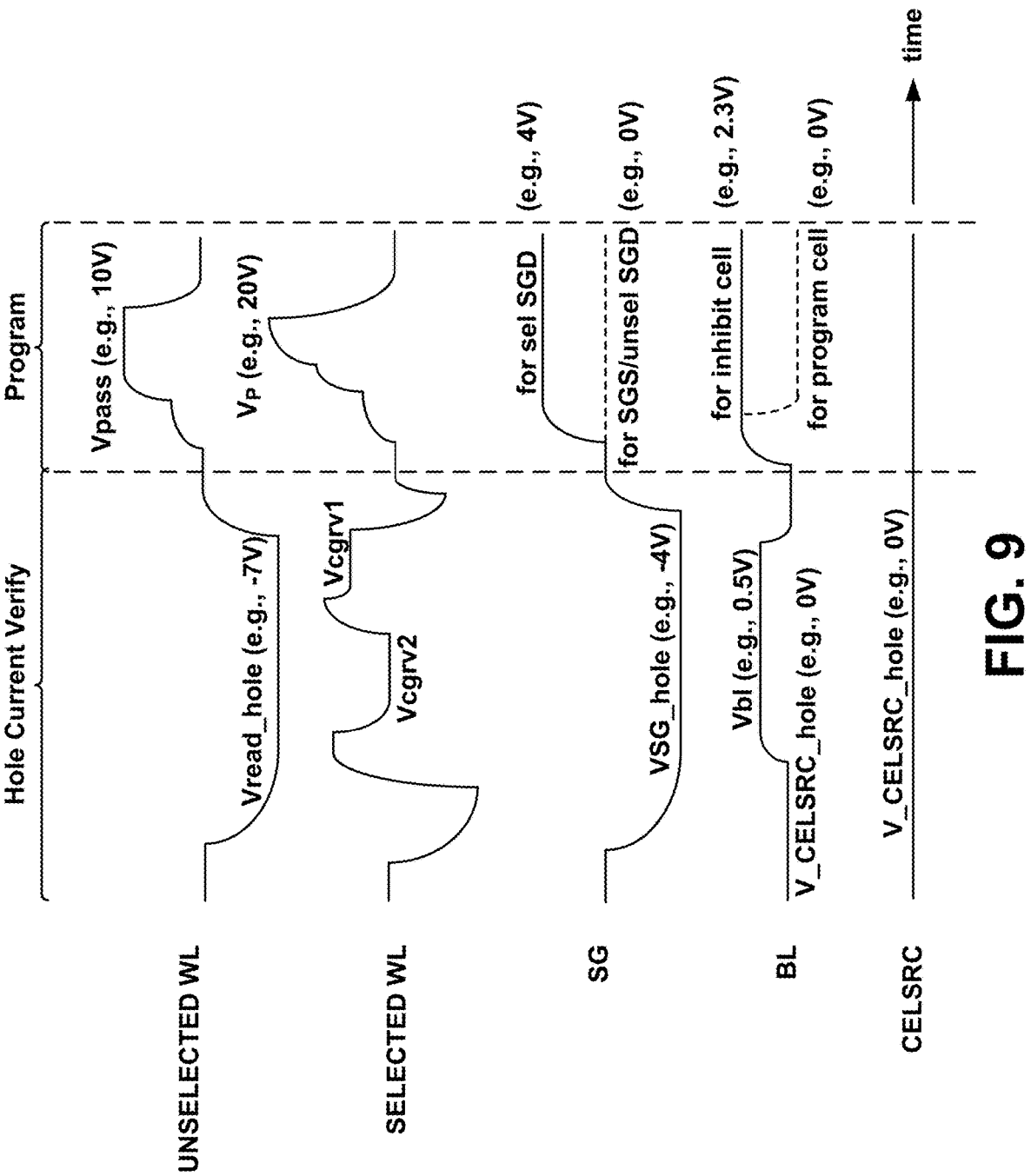
FIG. 9 depicts example voltages applied to various components of a memory block versus time during a verify operation of one program loop and a program operation of the following loop.

FIG. 9 depicts example voltages applied to various components of a memory block versus time during a verify operation of one program loop and a program operation of the following loop. FIG. 9 is similar to FIG. 8, but does not include a pre-charge step between the verify operation and the program operation.

In the embodiment depicted in FIG. 8, the verify operation is performed using electron current in the channel (referred to herein as "electron current verify"). In particular, a read pass voltage Vread (e.g., 7V) is applied to unselected word lines and VSG (e.g., 4V) is applied to open the drain- and source-side select gates to accumulate mobile electrons in the channel. In addition, Vbl (e.g., 0.5V) is applied to the selected bit line and the source line voltage is kept at VSS (e.g., 0V) to allow electrons in the channel to flow from source to the bit line while various verify voltage levels are applied to the selected word line.

In contrast, in the embodiment of FIG. 9 the verify operation is performed using hole current in the channel (referred to herein as "hole current verify"). In an embodiment of hole current verify, a read pass voltage Vread_hole (e.g., −7V) is applied to unselected word lines and VSG_hole (e.g., −4V) is applied to open the drain- and source-side select gates to accumulate mobile holes in the channel. In addition, Vbl (e.g., 0.5V) is applied to the selected bit line and the source line voltage is kept at V_CELSRC_hole (e.g., 0V) to allow holes in the channel to flow from bit line to the source while various verify voltage levels are applied to the selected word line.

In an embodiment, the bias on the selected word line ramps up and down to do the hole current verify at one or more verify voltage levels (e.g., vcgrv1 and vcgrv2), similarly to the electron current verify method.

In an embodiment, if the threshold voltage of the selected memory cell is greater than a verify voltage Vcgv (e.g., vcgrv1 or vcgrv2) applied to the selected word line, then the selected memory cell will turn ON. That is, a (hole) conduction current above a reference value is detected in the NAND string.

In contrast, if the threshold voltage of the selected memory cell is below a verify voltage Vcgv (e.g., vcgrv1 or vcgrv2) applied to the selected word line, then the selected memory cell will not turn ON. That is, a (hole) conduction current above a reference value is not detected in the NAND string.

In an embodiment, at the end of the verify operation the voltages applied to the control gates of all word lines (selected and unselected word lines) ramp up simultaneously (e.g., to 0V). In an embodiment, following the verify operation a program operation is performed, such as described above in FIG. 6. Indeed, in an embodiment, the program operation is the same as the program operation in the embodiment of FIG. 8.

In the example embodiment depicted in FIG. 9, a negative read pass voltage Vread_hole (e.g., −7V) is applied to unselected word lines, Vbl (e.g., 0.5V) is applied to the selected bit line and the source line voltage is kept at V_CELSRC_hole (e.g., 0V). Persons of ordinary skill in the art will understand that alternatively read pass voltage Vread_hole may have a non-negative value, and Vbl and V_CELSRC_hole can be raised to positive values (e.g., >7V) to provide sufficient overdrive for hole current. In such an alterative embodiment, a negative voltage for VSG_hole is desired to enhance mobile hole accumulation in the channel.

Without wanting to be bound by any particular theory, it is believed that performing a hole current verify operation eliminates the need for a pre-charge step. Without wanting to be bound by any particular theory, it is believed that by performing a hole current verify operation the NAND channel is intrinsically filled with holes after the verify. Without wanting to be bound by any particular theory, it is believed that by performing a hole current verify operation may reduce program time by eliminating a channel pre-charge step such as depicted in the FIG. 8 embodiment.

In an embodiment, by performing a hole current verify operation such as described above and depicted in FIG. 9, the word line program order can be normal order programming (e.g., sequentially from the source side to the drain side of a NAND string), or reverse order programming (e.g., sequentially from the drain side to the source side of a NAND string). Without wanting to be bound by any particular theory, it is believed that performing a hole current verify operation may provide design flexibility.

FIG. 10 is a flow diagram of a process 1000 for programming and verifying a threshold voltage of memory cell. In embodiments, process 1000 is performed on memory die 106 (FIG. 1), memory die 200 (FIG. 2B) or memory die 242 (FIG. 2B) using the control circuits discussed above. For example, process 600 can be performed at the direction of state machine 228 (FIGS. 2A-2B).

At step 1002, applying a program pulse to a plurality of word lines of a block of non-volatile memory cells, the block including a plurality of sub-blocks including a channel.

At step 1004, increasing a potential of the channel to a positive voltage level.

At step 1006, performing a verify test by applying a verify level to a first selected one of the word lines and sensing a conduction current in memory cells coupled to the first selected one of the word lines.

At step 1008, determining that the first selected one of the word lines passes the verify test.

In an embodiment, an apparatus is provided that includes a NAND string including a first memory cell coupled to a first word line, and a control circuit coupled to the NAND string. The control circuit is configured to apply a verify voltage to the first word line, perform a verify test on the first memory cell to sense a hole conduction current, and perform a program operation on the first memory cell without performing a pre-charge operation.

In an embodiment, an apparatus is provided that includes a NAND string including a memory cell coupled to a word line, and a control circuit coupled to the NAND string. The control circuit is configured to apply a verify voltage to the word line, determine that the memory cell is turned OFF, determine that a threshold voltage of the memory cell is less than the verify voltage, and apply a program pulse to the memory cell to increase the threshold voltage of the first memory cell.

In an embodiment, an method is provided that includes applying a program pulse to a plurality of word lines of a block of non-volatile memory cells, the block including a plurality of sub-blocks including a channel, increasing a potential of the channel to a positive voltage level, performing a verify test by applying a verify level to a first selected one of the word lines and sensing a conduction current in memory cells coupled to the first selected one of the word lines, and determining that the first selected one of the word lines passes the verify test.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a NAND string comprising a first memory cell coupled to a first word line; and
   a control circuit coupled to the NAND string, the control circuit configured to:
      apply a verify voltage to the first word line;
      perform a verify test on the first memory cell to sense a hole conduction current; and
      perform a program operation on the first memory cell without performing a pre-charge operation,
   wherein the NAND string comprises a second memory cell coupled to a second word line;
   the verify voltage comprises a positive voltage; and
   the control circuit is further configured to apply a negative voltage to the second word line during the verify test.

2. The apparatus of claim 1, wherein:
   the NAND string comprises a channel; and
   the control circuit is further configured to cause mobile holes to accumulate in the channel prior to performing the verify test.

3. The apparatus of claim 1, wherein:
   the NAND string comprises a second memory cell coupled to a second word line; and
   the control circuit is further configured to apply a negative voltage to the second word line prior to performing the verify test.

4. The apparatus of claim 3, wherein:
   the first memory cell and second memory cell comprise a channel; and
   the negative voltage applied to the second word line causes mobile holes to accumulate in the channel.

5. The apparatus of claim 1, wherein the control circuit is further configured to:
   determine that the sensed hole conduction current is above a reference value; and
   determine that the first memory cell did not pass the verify test.

6. The apparatus of claim 1, wherein the control circuit is further configured to:
   determine that the sensed hole conduction current is not above a reference value; and
   determine that the first memory cell passed the verify test.

7. The apparatus of claim 1, wherein the NAND string comprises a plurality of sub-blocks of memory cells.

8. The apparatus of claim 1, wherein the NAND string comprises a string sub-block of a block of memory cells.

9. The apparatus of claim 1, wherein the NAND string comprises a plurality of sub-block tiers.

*    *    *    *    *